US012658268B2

(12) United States Patent
Ahn et al.

(10) Patent No.: US 12,658,268 B2
(45) Date of Patent: Jun. 16, 2026

(54) NONVOLATILE MEMORY DEVICE AND METHOD OF OPERATING A NONVOLATILE MEMORY DEVICE

(71) Applicant: Samsung Electronics Co., Ltd., Suwon-si (KR)

(72) Inventors: Hyojin Ahn, Suwon-si (KR); Dongwoo Shin, Suwon-si (KR); Hoon Jo, Suwon-si (KR); Jeongyeol Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 133 days.

(21) Appl. No.: 18/799,934

(22) Filed: Aug. 9, 2024

(65) Prior Publication Data

US 2025/0218521 A1 Jul. 3, 2025

(30) Foreign Application Priority Data

Dec. 28, 2023 (KR) ........................ 10-2023-0193918

(51) Int. Cl.
| | |
|---|---|
| *G11C 11/34* | (2006.01) |
| *G11C 16/04* | (2006.01) |
| *G11C 16/08* | (2006.01) |
| *G11C 16/16* | (2006.01) |
| *G11C 16/34* | (2006.01) |

(52) U.S. Cl.
CPC ...... *G11C 16/3477* (2013.01); *G11C 16/0483* (2013.01); *G11C 16/08* (2013.01); *G11C 16/16* (2013.01); *G11C 16/3445* (2013.01)

(58) Field of Classification Search
CPC . G11C 16/3477; G11C 16/0483; G11C 16/08; G11C 16/16; G11C 16/3445

USPC ........................................................ 365/185.3
See application file for complete search history.

(56) References Cited

U.S. PATENT DOCUMENTS

| | | | | |
|---|---|---|---|---|
| 7,668,019 B2 * | 2/2010 | Byeon | ............... | G11C 16/3413 |
| | | | | 365/185.11 |
| 8,559,224 B2 | 10/2013 | Han et al. | | |
| 8,842,477 B2 | 9/2014 | Parker | | |
| 8,908,431 B2 | 12/2014 | Shim et al. | | |
| 8,923,053 B2 | 12/2014 | Han et al. | | |

(Continued)

FOREIGN PATENT DOCUMENTS

| | | | | |
|---|---|---|---|---|
| KR | 1692520 | 1/2017 | | |
| KR | 20170028673 A * | 3/2017 | ............. | G11C 16/08 |
| KR | 102358463 B1 * | 2/2022 | ......... | G11C 16/3445 |

*Primary Examiner* — Viet Q Nguyen
(74) *Attorney, Agent, or Firm* — Fish & Richardson P.C.

(57) ABSTRACT

In an example method of operating a nonvolatile memory device, an erase command and a block address designating a target memory block from a plurality of memory blocks are received. Whether the target memory block is an open block including at least one erased word-line is determined based on the erase command and the block address. A pre-program voltage having a first voltage level is applied to word-lines of the target memory block during pre-program period of a erase loop based on the target memory block being a closed block including only programmed word-lines. A pre-program voltage having a second voltage level greater than the first voltage level is applied to a portion of a region, including the at least one erased word-line, of the target memory block during the pre-program period based on the target memory block being the open block.

20 Claims, 31 Drawing Sheets

(56) References Cited

U.S. PATENT DOCUMENTS

| | | | |
|---|---|---|---|
| 9,147,492 B2 | 9/2015 | Shim et al. | |
| 9,624,765 B2 * | 4/2017 | Raglin | E21B 47/09 |
| 9,685,233 B2 * | 6/2017 | Hsieh | G11C 16/3459 |
| 9,818,477 B2 * | 11/2017 | Shim | G11C 11/5628 |
| 9,851,912 B2 * | 12/2017 | Nam | G06F 3/0655 |
| 10,074,440 B2 | 9/2018 | Ray et al. | |
| 10,431,315 B2 * | 10/2019 | Lee | G11C 16/16 |
| 10,665,303 B1 * | 5/2020 | Lee | G11C 16/0483 |
| 10,902,928 B2 | 1/2021 | Park | |
| 11,043,273 B2 * | 6/2021 | Shin | G11C 16/10 |
| 11,386,969 B1 | 7/2022 | Banerjee et al. | |
| 12,039,186 B2 * | 7/2024 | Kim | G06F 3/0659 |
| 12,422,466 B2 * | 9/2025 | Park | G01R 31/2637 |
| 2022/0262439 A1 | 8/2022 | Shiino et al. | |
| 2024/0420772 A1 * | 12/2024 | Park | G11C 16/107 |

* cited by examiner

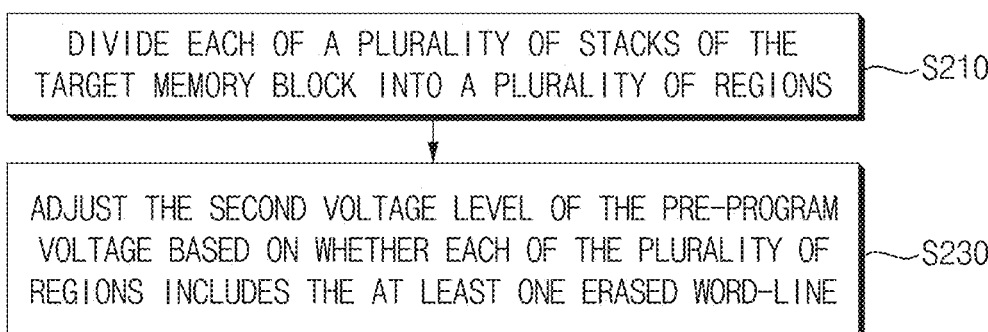

DIVIDE EACH OF A PLURALITY OF STACKS OF THE TARGET MEMORY BLOCK INTO A PLURALITY OF REGIONS ⸺S210

ADJUST THE SECOND VOLTAGE LEVEL OF THE PRE-PROGRAM VOLTAGE BASED ON WHETHER EACH OF THE PLURALITY OF REGIONS INCLUDES THE AT LEAST ONE ERASED WORD-LINE ⸺S230

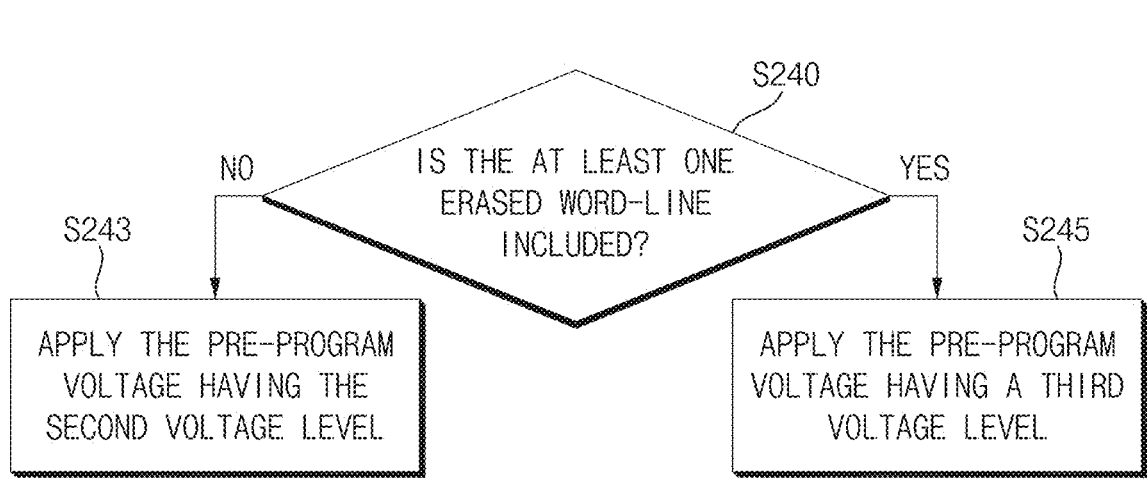

S240

IS THE AT LEAST ONE ERASED WORD-LINE INCLUDED?

NO          YES

S243

APPLY THE PRE-PROGRAM VOLTAGE HAVING THE SECOND VOLTAGE LEVEL

S245

APPLY THE PRE-PROGRAM VOLTAGE HAVING A THIRD VOLTAGE LEVEL

Figures 4, 5, 6:
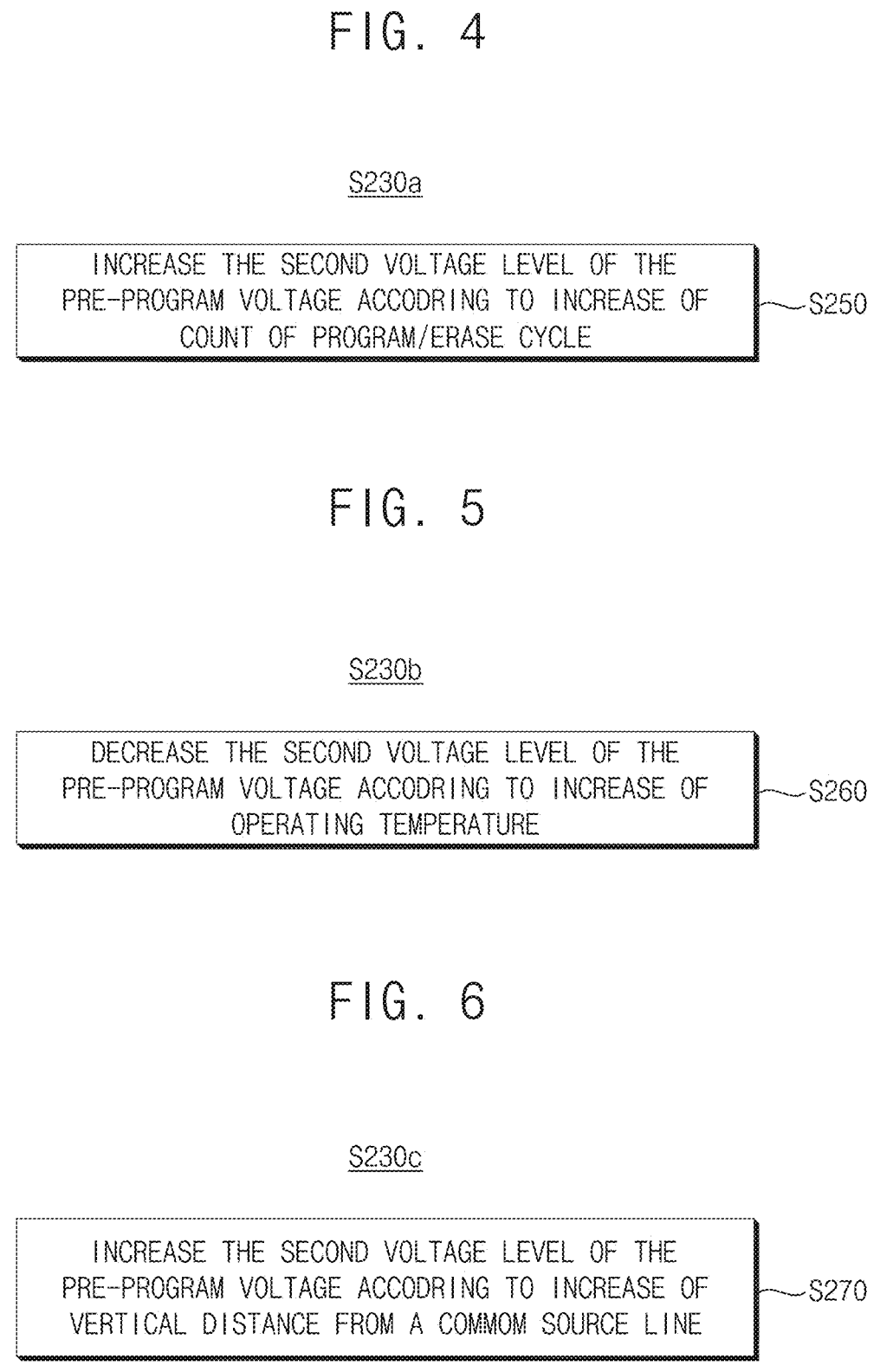

| |
|---|
| INCREASE THE SECOND VOLTAGE LEVEL OF THE PRE-PROGRAM VOLTAGE ACCODRING TO INCREASE OF COUNT OF PROGRAM/ERASE CYCLE |

| |
|---|
| DECREASE THE SECOND VOLTAGE LEVEL OF THE PRE-PROGRAM VOLTAGE ACCODRING TO INCREASE OF OPERATING TEMPERATURE |

| |
|---|
| INCREASE THE SECOND VOLTAGE LEVEL OF THE PRE-PROGRAM VOLTAGE ACCODRING TO INCREASE OF VERTICAL DISTANCE FROM A COMMOM SOURCE LINE |

~S270

☒ :VALID PAGE

☒ :INVALID PAGE

☐ :ERASED PAGE

BLKz

BLK2

BLK1

VD

HD2    HD1

BLKi

Figure 25:
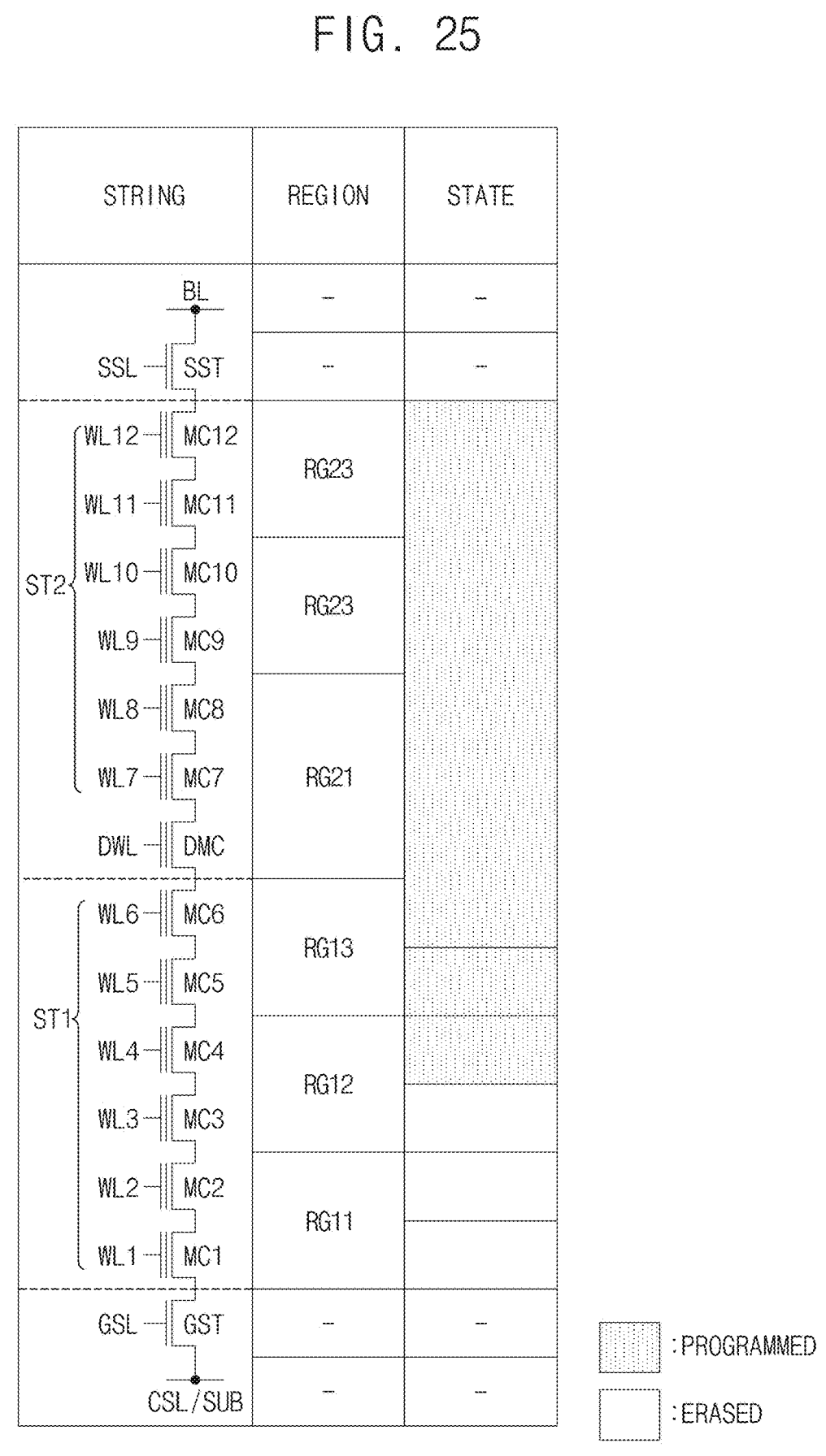

| STRING | REGION | STATE |
|--------|--------|-------|
| BL | – | – |
| SSL — SST | – | – |
| WL12 — MC12 | RG23 | ░░░ |
| WL11 — MC11 | RG23 | ░░░ |
| WL10 — MC10 | RG23 | ░░░ |
| WL9 — MC9 | RG23 | ░░░ |
| WL8 — MC8 | RG21 | ░░░ |
| WL7 — MC7 | RG21 | ░░░ |
| DWL — DMC | | ░░░ |
| WL6 — MC6 | RG13 | ░░░ |
| WL5 — MC5 | RG13 | ░░░ |
| WL4 — MC4 | RG12 | |
| WL3 — MC3 | RG12 | |
| WL2 — MC2 | RG11 | |
| WL1 — MC1 | RG11 | |
| GSL — GST | – | – |
| CSL/SUB | – | – |

ST2 { WL12 … WL7 }
ST1 { WL6 … WL1 }

░░░ : PROGRAMMED

☐ : ERASED

FIG. 28

| P/E CYCLE | 1000 | 2000 | 3000 |
|---|---|---|---|
| VPPGM2 | VPPGM2a | VPPGM2b | VPPGM2c |

VPPGM2a<VPPGM2b<VPPGM2c

FIG. 29

| TEMPERATURE | −20~20℃ | 20~60℃ | 60~100℃ |
|---|---|---|---|
| VPPGM2 | VPPGM2d | VPPGM2e | VPPGM2f |

VPPGM2d>VPPGM2e>VPPGM2f

FIG. 30

| DISTANCE | RNG1 | RNG2 | RNG3 |
|---|---|---|---|
| VPPGM2 | VPPGM2g | VPPGM2h | VPPGM2i |

RNG1<RNG2<RNG3
VPPGM2g<VPPGM2h<VPPGM2i

CUTTING

WF2
WF1

BONDING

WF1

WF2

NONVOLATILE MEMORY DEVICE AND METHOD OF OPERATING A NONVOLATILE MEMORY DEVICE

CROSS-REFERENCE TO RELATED APPLICATION

This application claims priority under 35 USC § 119 to Korean Patent Application No. 10-2023-0193918, filed on Dec. 28, 2023, in the Korean Intellectual Property Office (KIPO), the disclosure of which is incorporated by reference herein in its entirety.

BACKGROUND

Semiconductor memory devices for storing data may be classified into volatile memory devices and nonvolatile memory devices. Volatile memory devices, such as dynamic random access memory (DRAM) devices, are typically configured to store data by charging or discharging capacitors in memory cells, and lose the stored data when power is off. Nonvolatile memory devices, such as flash memory devices, may maintain stored data even though power is off. Volatile memory devices are widely used as main memories of various apparatuses, while nonvolatile memory devices are widely used for storing program codes and/or data in various electronic devices, such as computers, mobile devices, etc.

Recently, nonvolatile memory devices of three-dimensional structure such as a vertical NAND memory devices have been developed to increase integration degree and memory capacity of the nonvolatile memory devices. Along with increases in the integration degree and memory capacity, characteristic of a portion of memory cells may be degraded when an erase operation of the nonvolatile memory device is performed.

SUMMARY

The present disclosure relates to a method of operating a nonvolatile memory device, capable of preventing memory cells from being over erased and a method of controlling an erase operation of a nonvolatile memory device, capable of enhancing a characteristic of a boundary word-line.

In general, according to some aspects, a method of operating a nonvolatile memory device is provided. The nonvolatile memory device includes a plurality of memory blocks, each of which includes a plurality of cell strings where each of the plurality of cell strings includes a string selection transistor, a plurality of memory cells and a ground selection transistor which are connected in series and arranged in a vertical direction between each of a plurality of bit-lines and a common source line. According to the method, an erase command and a block address designating a target memory block from the plurality of memory blocks are received, whether the target memory block is an open block including at least one erased word-line is determined based on the erase command and the block address, a pre-program voltage having a first voltage level is applied to word-lines of the target memory block during pre-program period of a erase loop, in response to the target memory block being a closed block including only programmed word-lines, and a pre-program voltage having a second voltage level greater than the first voltage level is applied to a portion of a region including the at least one erased word-line, of the target memory block during the pre-program period, in response to the target memory block being the open block.

In general, according to some aspects, a nonvolatile memory device includes a memory cell array and a control circuit. The memory cell array includes a plurality of memory blocks, each of which includes a plurality of cell strings where each of the plurality of cell strings includes a string selection transistor, a plurality of memory cells and a ground selection transistor which are connected in series and arranged in a vertical direction between each of a plurality of bit-lines and a common source line. The control circuit controls an erase operation on a target memory block by determining whether the target memory block is an open block including at least one erased word-line based on an erase command and a block address designating the target memory block from the plurality of memory block, applying a pre-program voltage having a first voltage level to word-lines of the target memory block during pre-program period of a erase loop, in response to the target memory block being a closed block including only programmed word-lines and applying a pre-program voltage having a second voltage level greater than the first voltage level to a portion of a region including the at least one erased word-line, of the target memory block during the pre-program period, in response to the target memory block being the open block.

In general, according to some aspects, a nonvolatile memory device includes a memory cell array, control circuit a voltage generator and an address decoder. The memory cell array includes a plurality of memory blocks, each of which includes a plurality of cell strings where each of the plurality of cell strings includes a string selection transistor, a plurality of memory cells and a ground selection transistor which are connected in series and arranged in a vertical direction between each of a plurality of bit-lines and a common source line. The control circuit controls an erase operation on a target memory block by determining whether the target memory block is an open block including at least one erased word-line based on an erase command and a block address designating the target memory block from the plurality of memory block, applying a pre-program voltage having a first voltage level to word-lines of the target memory block during pre-program period of a erase loop, in response to the target memory block being a closed block including only programmed word-lines and applying a pre-program voltage having a second voltage level greater than the first voltage level to a portion of a region including the at least one erased word-line, of the target memory block during the pre-program period, in response to the target memory block being the open block. The voltage generator generates word-line voltages including the pre-program voltage and the erase voltage based on control signals. The address decoder provide the word-line voltages to the target memory block based on a row address. The control circuit returns the second voltage level of the pre-program voltage to the first voltage level after an erase operation on the open block is completed.

Therefore, in the nonvolatile memory device and the method of operating a nonvolatile memory device, when a target memory block to be erased is an open block including at least one erased word-line, a pre-program operation is performed on the target memory block by increasing a voltage level of a pre-program voltage applied to word-lines of the target memory block. Accordingly, even when the erase operation on the open block is repeated, the memory cells coupled to the erased word-line may be prevented from being over-erased and threshold voltage distributions of memory cells coupled to the erased word-line may be optimally maintained.

BRIEF DESCRIPTION OF THE DRAWINGS

Illustrative, non-limiting example implementations will be more clearly understood from the following detailed description in conjunction with the accompanying drawings.

FIG. 2 is a flow chart illustrating an example of an operation of applying the pre-program voltage having a second voltage level in FIG. 1.

FIG. 3 is a flow chart illustrating an example of an operation of adjusting the second voltage level of the pre-program voltage in FIG. 2.

FIG. 4 is a flow chart illustrating an example of an operation of adjusting the second voltage level of the pre-program voltage in FIG. 2.

FIG. 5 is a flow chart illustrating an example of an operation of adjusting the second voltage level of the pre-program voltage in FIG. 2.

FIG. 6 is a flow chart illustrating an example of an operation of adjusting the second voltage level of the pre-program voltage in FIG. 2.

FIG. 12 is a block diagram illustrating an example of the memory controller in the memory system of FIG. 9.

FIG. 22 is a cross-sectional view for describing an example of a boundary portion included in a memory block.

FIG. 25 is an example diagram illustrating that a plurality of stacks of a target memory block are divided into a plurality of regions.

FIG. 28 illustrates an example that the control circuit adjusts a voltage level of the pre-program voltage based on program/erase cycles.

FIG. 29 illustrates an example that the control circuit adjusts a voltage level of the pre-program voltage based on an operating temperature of the nonvolatile memory device.

FIG. 30 illustrates an example that the control circuit adjusts a voltage level of the pre-program voltage based on a distance from a common source line.

FIG. 31 illustrates an example of a plurality of erase loops performed on at least one sub-block to be erased.

FIG. 33 is a diagram illustrating an example of a manufacturing process of a stacked semiconductor device.

DETAILED DESCRIPTION

Various example implementations will be described more fully hereinafter with reference to the accompanying drawings, in which some example implementations are shown.

Figure 1:
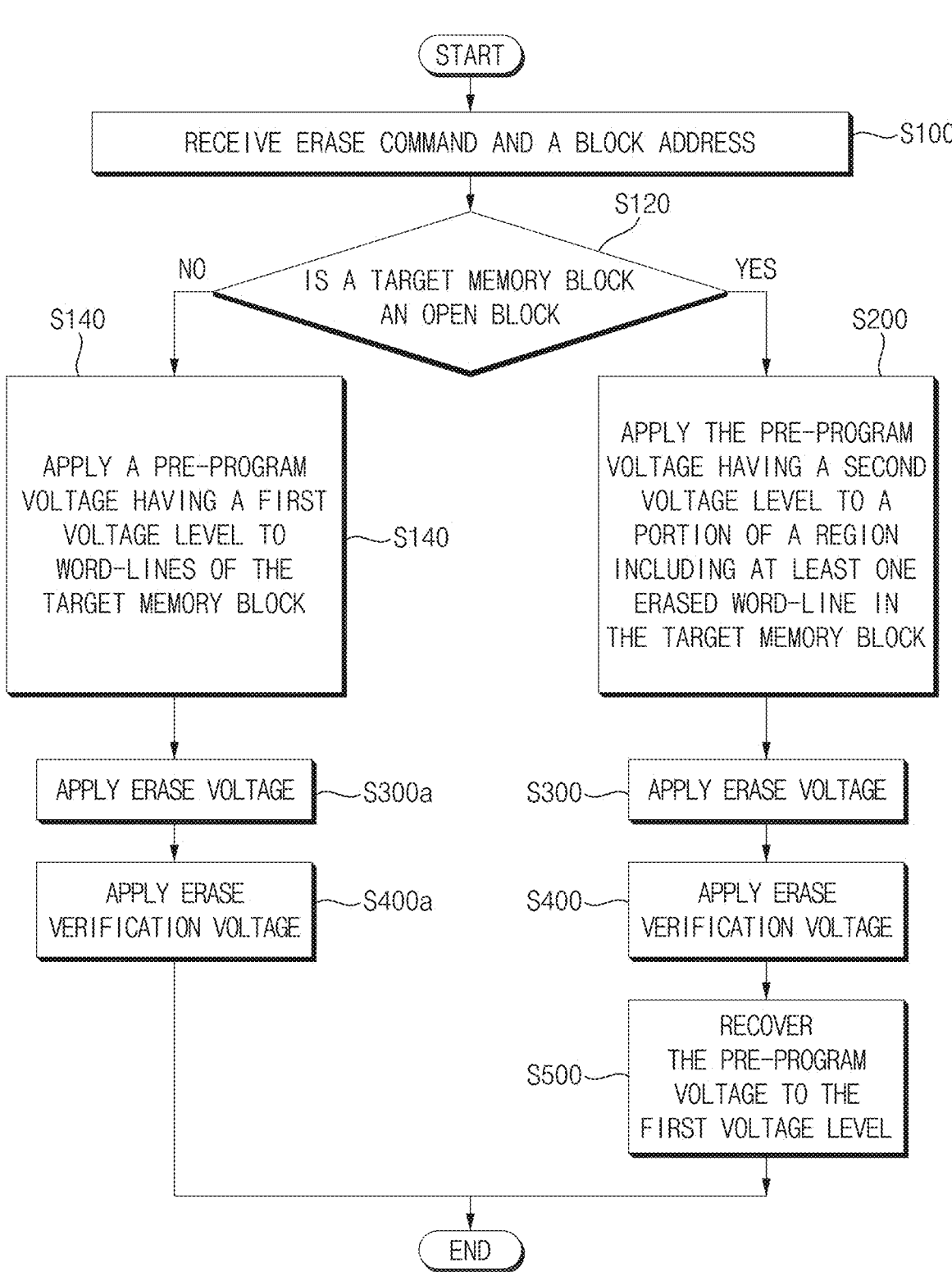
FIG. 1 is a flow chart illustrating an example of a method of operating a nonvolatile memory device.

FIG. 1 is a flow chart illustrating an example of a method of operating a nonvolatile memory device.

FIG. 1 illustrates a method of operating nonvolatile memory device including a plurality of memory blocks, each of which includes a plurality of cell strings, where each cell string includes a string selection transistor, a plurality of memory cells and a ground selection transistor connected in series and arranged in a vertical direction between a bit-line and a common source line. In some implementations, the nonvolatile memory device may include a three-dimensional NAND flash memory device or a vertical NAND flash memory device.

Referring to FIG. 1, an erase command and a block address designating a target memory block from the plurality of memory blocks are received from an outside of the nonvolatile memory device such as an external memory controller (operation S100).

It is determined whether the target memory block is an open block including at least one erased word-line based on the erase command and the block address (operation S120). Operation of determining whether the target memory block is an open block including at least one erased word-line may be performed based on status information indicating whether word-lines in the target memory block are programmed.

In response to the target memory block being a closed block including only programmed word-lines (NO in S120) (i.e., in response to the target memory block not being the open block), a pre-program voltage having a first voltage level is applied to word-lines of the target memory block during pre-program period of a erase loop (operation S140). That is, a pre-program operation is performed on the target memory block.

In response to the target memory block being the open block (YES in S120), a pre-program voltage having a second voltage level greater than the first voltage level is applied to a portion of a region including the at least one erased word-line, of the target memory block during the pre-program period (operation S200). That is, the pre-program operation is performed on the target memory block.

The pre-program voltage having the first voltage level may be referred to as a first pre-program voltage and the pre-program voltage having the second voltage level may be referred to as a second pre-program voltage.

During an erase execution period of the erase loop, an erase voltage is applied to a channel of the target memory block that is the open block (operation S300) to erase memory cells of the target memory block. The word-lines of the target memory block may be floated while the erase voltage being applied to the channel of the target memory block.

During an erase verification period of the erase loop successive to the erase execution period, an erase verification voltage is applied to word-lines of the target memory block that is the open block (operation S400) to verify erased state of the memory cells of the target memory block.

The second voltage level of the pre-program voltage is returned (i.e., is recovered) to the first voltage level posterior to the erase verification period (operation S500).

During the erase execution period of the erase loop, an erase voltage is applied to a channel of the target memory block that is the closed block (operation S300a) to erase memory cells of the target memory block. The word-lines of the target memory block may be floated while the erase voltage being applied to the channel of the target memory block.

During the erase verification period of the erase loop successive to the erase execution period, an erase verification voltage is applied to word-lines of the target memory block that is the closed block (operation S400a) to verify erased state of the memory cells of the target memory block.

The open (memory) block may refer to a memory block including a word-line (hereinafter referred to as a "programmed word-line") connected to programmed memory cells and a word-line (hereinafter referred to as an "erased word-line") connected with memory cells of an erased state. In some implementations, the open block may include a memory cell of a programmed state and a memory cell of an erased state.

The memory cell of the programmed state may be included in the programmed word-line, and the memory cell of the erased state may be included in the erased word-line. An external memory controller may close an open block by programming all erased word-lines of the open block. Accordingly, since all memory cells connected with word-lines of the open block have a programmed state, the open block may switch into a closed block.

In some implementations, the closed block may refer to a memory block including only word-lines connected with programmed memory cells. Each memory cell of the closed block may store specific data corresponding to a programmed state. Each memory cell of the closed block may not store specific data corresponding to a programmed state.

As erase operation on an open block including at last one erased word-line is repeated, threshold voltage distributions of memory cells coupled to the erased word-line are shifted to a negative direction and the memory cells coupled to the erased word-line may be over-erased. When the memory cells are over-erased, lateral charge loss of adjacent memory cells are increased and thus, retention characteristic of the memory cells may be degraded. However, in a method of operating a nonvolatile memory device according to some implementations, a pre-program voltage having a voltage level greater than a voltage level of a pre-program voltage applied to the closed block is applied to the open block before performing erase operation on the open block, and thus threshold voltage distributions of memory cells coupled to the erased word-line are shifted to a positive direction in advance. Therefore, even when the erase operation on the open block is repeated, the memory cells coupled to the erased word-line may be prevented from being over-erased and threshold voltage distributions of memory cells coupled to the erased word-line may be optimally maintained.

FIG. 2 is a flow chart illustrating an example of an operation of applying the pre-program voltage having a second voltage level in FIG. 1.

Figure 21A:
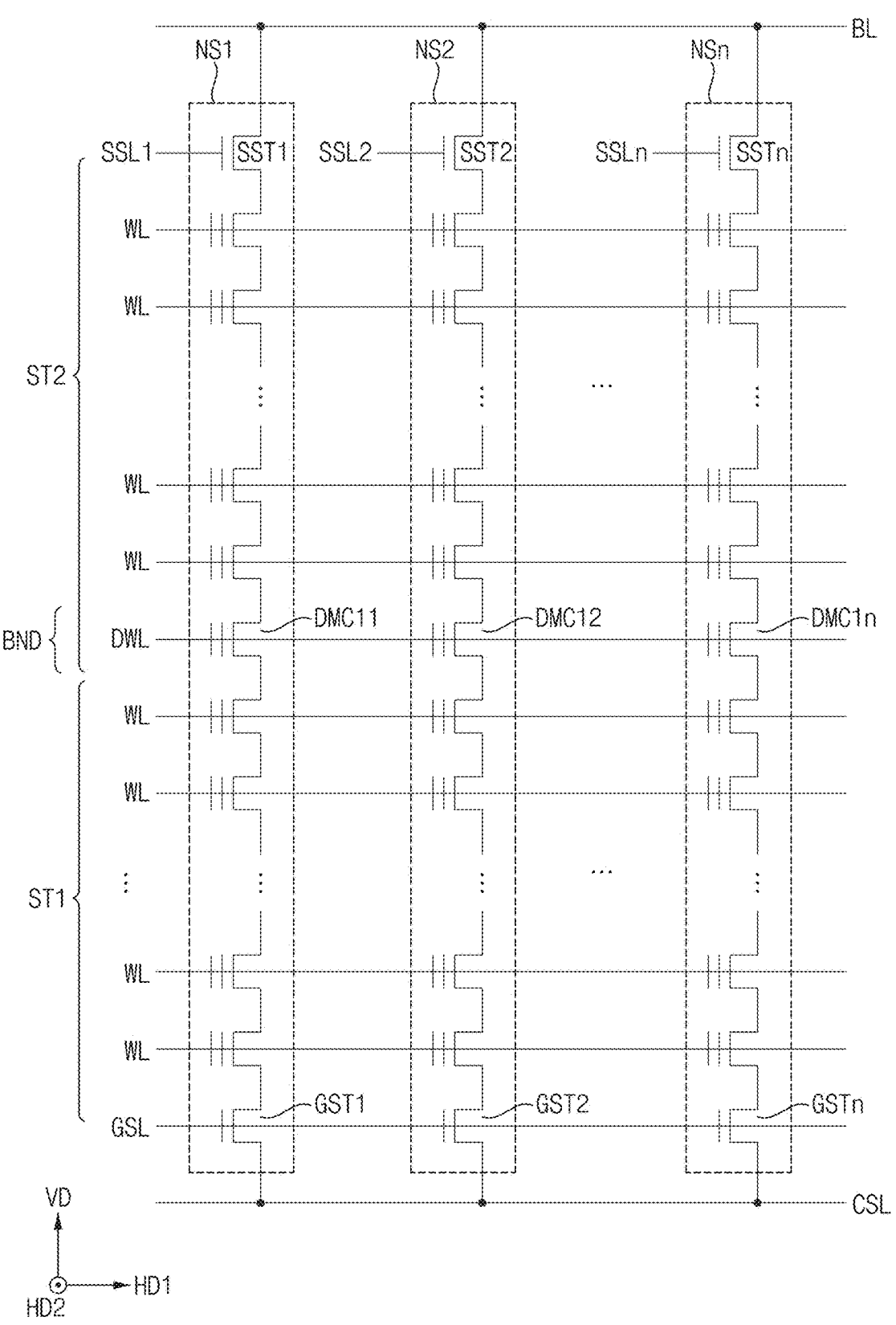
FIG. 21A is a circuit diagram illustrating an example of a structure of a memory cell array.
Figure 22:
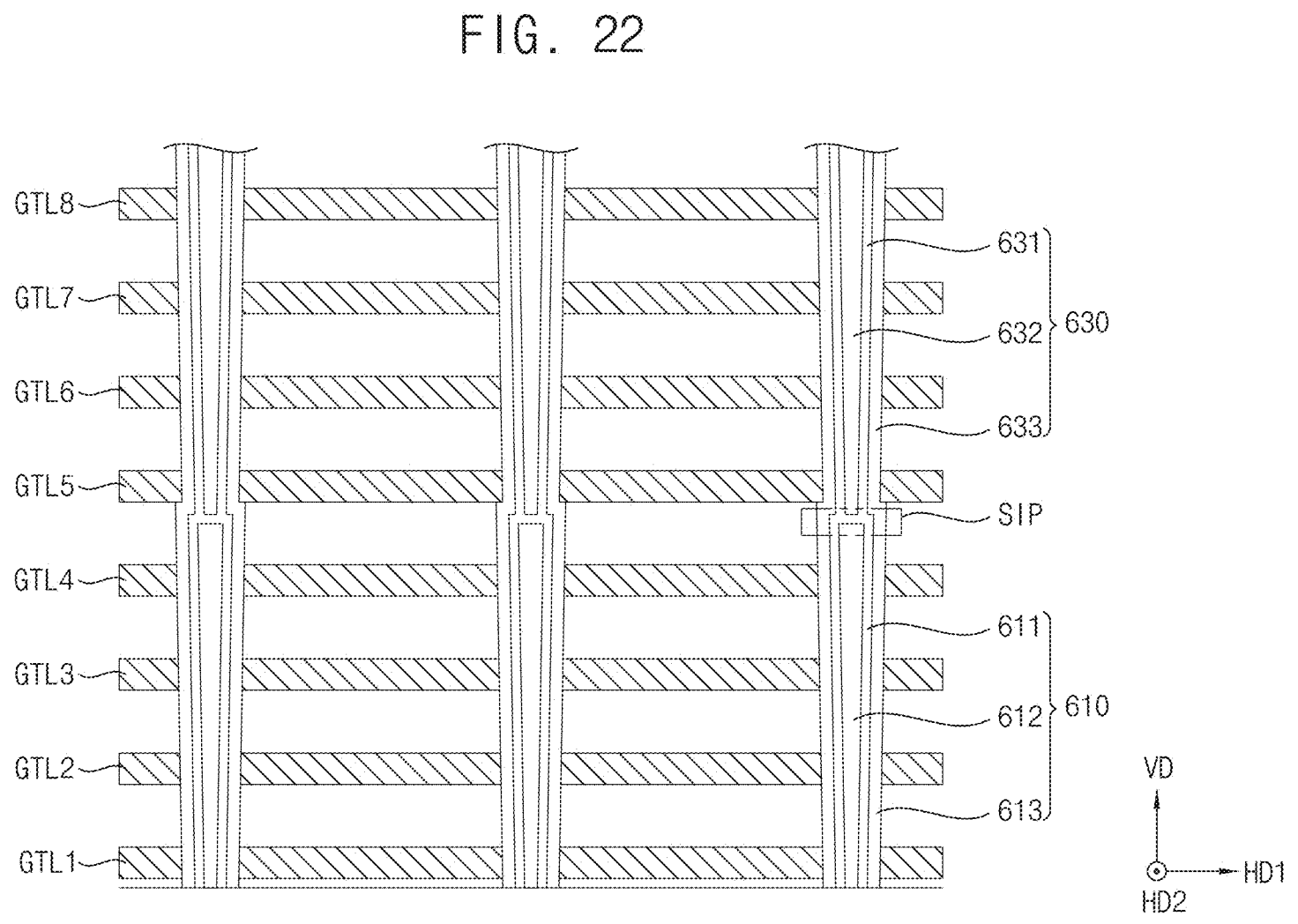

In FIG. 2, assuming that a plurality of cell strings in the target memory blocks are divided into a plurality of stacks in the vertical direction as in FIGS. 21A through 22.

Referring to FIG. 2, for applying the pre-program voltage having the second voltage level to a portion of a region including the at least one erased word-line (operation S200), each of the plurality of stacks of the target memory block is divided into a plurality of regions (operation S210), and the second voltage level of the pre-program voltage is adjusted based on whether each of the plurality of regions includes the at least one erased word-line (operation S230).

FIG. 3 is a flow chart illustrating an example of an operation of adjusting the second voltage level of the pre-program voltage in FIG. 2.

Referring to FIG. 3, for adjusting the second voltage level of the pre-program voltage (operation S230), it is determined whether each of the each of the plurality of regions includes the at least one erased word-line (operation S240). When at least a first region from the plurality of regions does not include the at least one erased word-line (NO in S240), the pre-program voltage having the second voltage level is applied to at least the first region (operation S243).

When at least a second region from the plurality of regions includes the at least one erased word-line (YES in S240), the pre-program voltage having a third voltage level greater than the second voltage level is applied to at least the second region (operation S245).

That is, the pre-program operation is performed on the open block by applying the pre-program voltage having the second voltage level to a region including only programmed word-lines and by applying the pre-program voltage having the third voltage level to a region including the at least one erased word-line.

FIG. 4 is a flow chart illustrating an example of an operation of adjusting the second voltage level of the pre-program voltage in FIG. 2.

Referring to FIG. 4, for adjusting the second voltage level of the pre-program voltage (operation S230a), the second voltage level of the pre-program voltage applied to at least one target region including the at least one erased word-line, from the plurality of regions, is increased according to increase of program/erase cycle count of the at least one target region (operation S250).

The program/erase cycle count of the at least one target region may be divided into a plurality of ranges, and a second voltage level in case of the program/erase cycle count of the at least one target region being in a second range may be greater than a first voltage level in case of the program/erase cycle count of the at least one target region being in a first range smaller than the second range.

FIG. 5 is a flow chart illustrating an example of an operation of adjusting the second voltage level of the pre-program voltage in FIG. 2.

Referring to FIG. 5, for adjusting the second voltage level of the pre-program voltage (operation S230*b*), the second voltage level of the pre-program voltage applied to at least one target region including the at least one erased word-line, from the plurality of regions, is decreased according to increase of an operating temperature of the nonvolatile memory device. (operation S260).

The operating temperature of the nonvolatile memory device may be divided into a plurality of ranges, and a second voltage level in case of the operating temperature being in a second range may be smaller than a first voltage level in case of the operating temperature being in a first range smaller than the second range.

FIG. 6 is a flow chart illustrating an example of an operation of adjusting the second voltage level of the pre-program voltage in FIG. 2.

Referring to FIG. 6, for adjusting the second voltage level of the pre-program voltage (operation S230*c*), the second voltage level of the pre-program voltage applied to at least one target region including the at least one erased word-line, from the plurality of regions, is increased according to increase of a distance to the at least one target region from the common source line in the vertical direction (operation S270).

The distance to the at least one target region may be divided into a plurality of ranges, a second voltage level in case of the distance to the at least one target region being in a second range may be greater than a first voltage level in case of the distance to the at least one target region being in a first range smaller than the second range.

The distance to the at least one target region may be determined based on a row address designating the erased word-line in the at least one target region.

Figure 7:
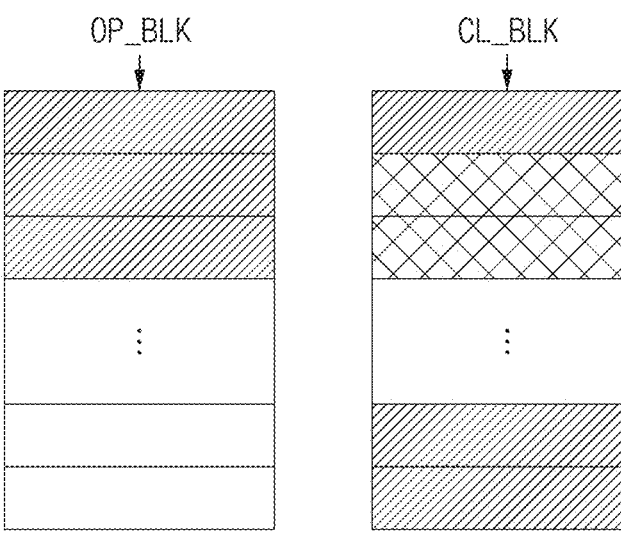
FIG. 7 illustrates examples of an open block and a closed block.

FIG. 7 illustrates examples of an open block and a closed block.

Referring to FIG. 7, when the target memory block includes at least one erased page (erased word page), the target memory block is determined as an open block OP_BLK. The open block OP_BLK may include at least one erased page (erased word-line) and at least one valid page (programmed word-line).

When the target memory block includes only valid pages (programmed word-line) and at least one invalid page and does not include the erased page (erased word-line), the target memory block is determined as a closed block CL_BLK.

Figure 8:
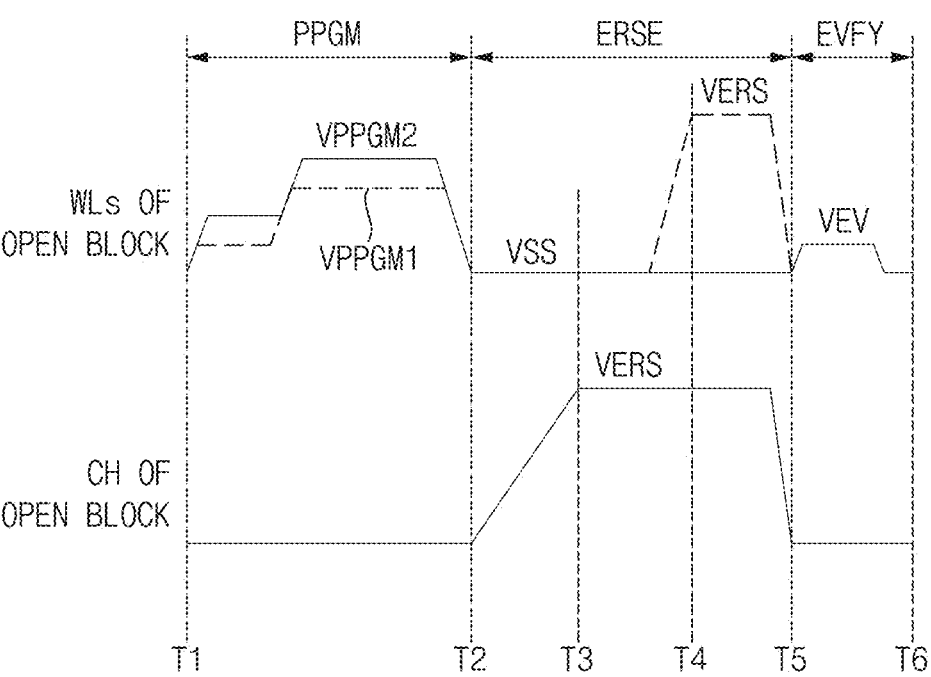
FIG. 8 is a timing diagram illustrating an example of a method of operating a nonvolatile memory device.

FIG. 8 is a timing diagram illustrating an example of a method of operating a nonvolatile memory device.

FIG. 8 illustrates a pre-program period PPGM, an erase execution period ERSE and an erase verification period EVFY of one of a plurality of erase loops. Time points T1, T2, T5 and T6 represent boundaries of the periods.

Referring to FIG. 8, during the pre-program period PPGM between the time points T1 and T2, a pre-program voltage VPPGM1 having a first voltage level is applied to the closed block not including an erased word-line and a pre-program voltage VPPGM2 having a second voltage level greater than the first voltage level is applied to the open block including at least one erased word-line. Therefore, memory cells of the target memory block are pre-programmed.

During the erase execution period ERSE between the time points T2 and T5, an erase voltage VERS is applied to a channel of the target memory block. The erase voltage VERS starts to ramp at the time point T2 and arrives at a target level at a time point T3. During the erase execution period ERSE, the word-lines of the target memory block are floated and word-lines of the target memory block are coupled to the erase voltage VERS.

During the erase execution period ERSE, the memory cells of the target memory block may be erased by applying a word-line erase voltage having a ground voltage VSS level to the word-lines of the target memory block or by floating the word-lines of the target memory block from a time point T4.

During the erase verification period EVFY between the time points T5 and T6, an erase verification voltage VEV is applied to the word-lines of the target memory block for verifying erased states of the memory cells coupled to the word-lines of the target memory block.

Performing the erase operation by applying the erase voltage VERS to the channel may be performed by using a gate induced drain leakage (GIDL). As understood from the name itself, the GIDL indicates a phenomenon that a leakage occurs at a drain of a transistor by a gate of the transistor. For example, when 0V or a negative voltage level is applied to the gate and a sufficiently high positive voltage is applied to the drain, severe band bending may be induced in the oxide near the drain and thus band-to-band tunneling from the valence band of the silicon surface to the conduction band of the silicon body may occur.

The tunneling elections are attracted to the drain and the drain current increases. Usually the semiconductor substrate is biased by a ground voltage, and holes are attracted to the semiconductor substrate of a relatively low voltage. The gate voltage of a negative voltage level is used to turn off the transistor, but the transistor operates as if it is turned on because the drain current of the GIDL current increases due to the GIDL phenomenon. The GIDL current increases as the gate voltage is decreased and/or the drain voltage is increased.

The erase operation may be performed by using the GIDL phenomenon. For generating the GIDL phenomenon, a string selection transistor of a cell string, a ground selection transistor of a cell string, or a GIDL transistor may be used, which will be described with reference to FIGS. 17B through 17D.

Figure 9:
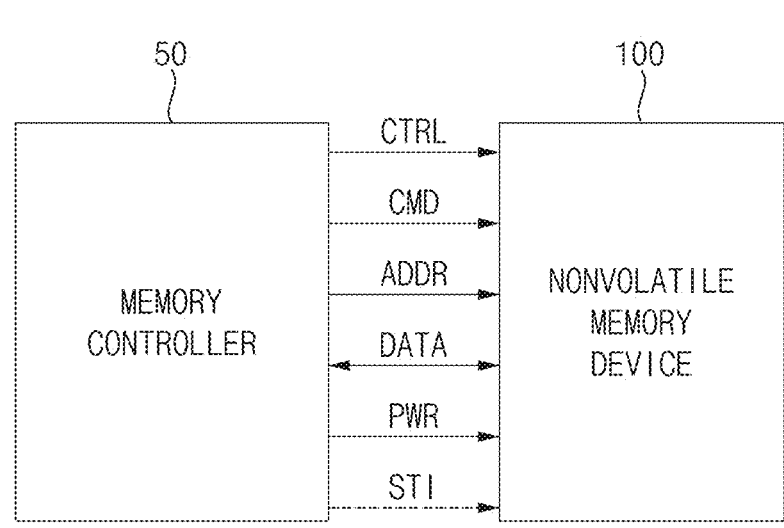
FIG. 9 is a block diagram illustrating an example of a memory system.

FIG. 9 is a block diagram illustrating an example of a memory system.

Referring to FIG. 9, a memory system (i.e., a storage device) 10 may include a memory controller 50 and at least one nonvolatile memory device (i.e. a nonvolatile memory device) 100.

In some implementations, each of the memory controller 50 and the nonvolatile memory device 100 may be provided with the form of a chip, a package, or a module. Alternatively, the memory controller 50 and the nonvolatile memory device 100 may be packaged into one of various packages.

The nonvolatile memory device 100 may perform an erase operation, a program operation or a read operation under control of the memory controller 50. The nonvolatile memory device 100 may receive a command CMD, an address ADDR and data DATA through input/output lines from the memory controller 50 for performing such operations. In addition, the nonvolatile memory device 100 may receive a control signal CTRL through a control line from the memory controller 50. In addition, the nonvolatile memory device 100 may receive a power PWR through a power line from the memory controller 50. In addition, the nonvolatile memory device 100 may receive status information STI indicating whether each of word-lines in the target memory block is an erased word-line from the memory controller 50.

Figure 10:
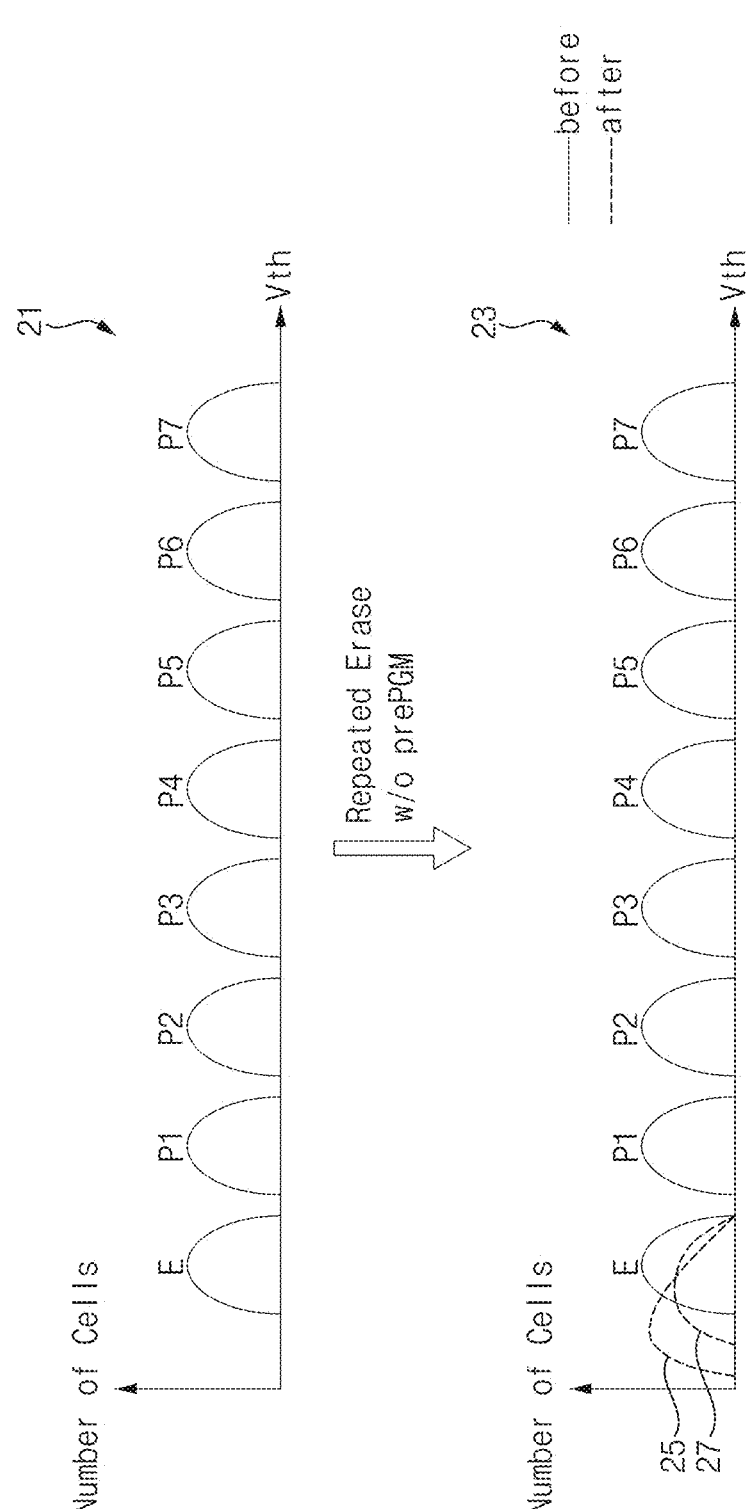
FIG. 10 is a graph showing an example of a memory cell distribution change obtained through repetitive erase operations.

FIG. 10 is a graph showing an example of a memory cell distribution change obtained through repetitive erase operations.

Referring to FIG. 6, a reference numeral 21 corresponds to an initial memory cell distribution based on a threshold voltage, the horizontal axis indicates a threshold voltage "Vth", and the vertical axis indicates the number of memory cells. For example, when a memory cell is a triple-level cell which is programmed by three bits, the memory cell may be in one of an erased state E, a first program state P1, a second program state P2, a third program state P3, a fourth program state P4, a fifth program state P5, a sixth program state P6 and a seventh program state P7.

A reference numeral 23 corresponds to a memory cell distribution obtained through changing by a repetitive erase operation, the horizontal axis indicates a threshold voltage "Vth", and the vertical axis indicates the number of memory cells. When the erase operation is repeatedly performed without performing the pre-program operation on the memory cells before performing the erase operation, an erase voltage that is a high voltage may be applied to a memory cell in the erased state E.

Therefore, as indicated by a reference numeral 25, over-erasure where threshold voltages of some memory cells become lower than an initial erased state E occurs. A trap may be generated in a gate insulation layer due to the over-erasure, and for this reason, a corresponding memory cell is deteriorated. Also, electrons stored in the charge trap layer may move to the substrate in the erase operation, and holes of the substrate may move to the charge trap layer. In this case, holes may be excessively accumulated in the charge trap layer due to the over-erasure, and for this reason, a retention characteristic of an adjacent cell is deteriorated.

In addition, when the memory cells are shallow-erased as indicated by a reference numeral 27, a read disturbance may occur because a margin between the erased state E and the first program state P1 is reduced.

Figure 11:
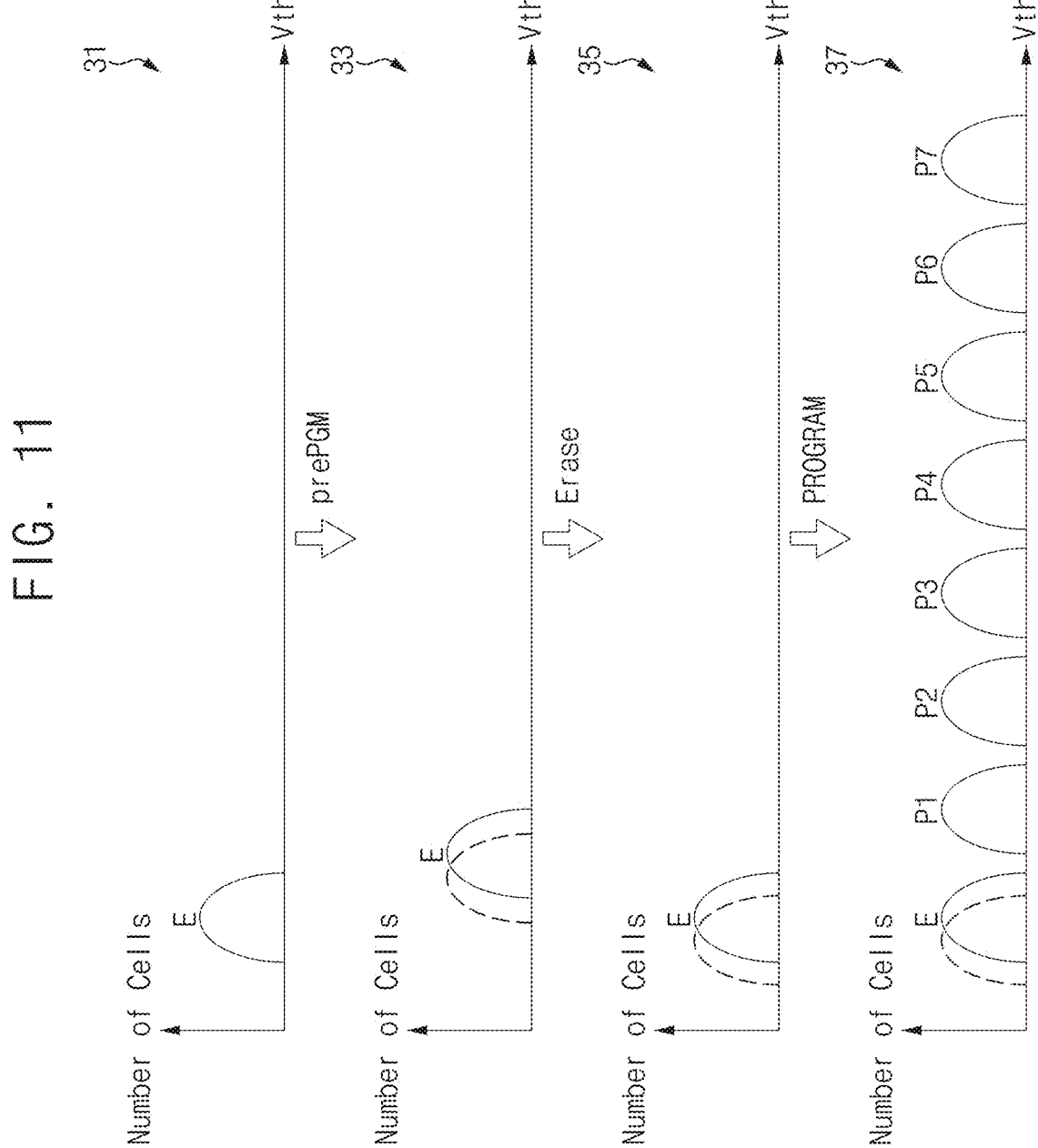
FIG. 11 is a graph showing an example of a memory cell distribution of an erased word-line.

FIG. 11 is a graph showing an example of a memory cell distribution of an erased word-line.

Referring to FIG. 11, a reference numeral 31 corresponds to a memory cell distribution before a pre-program operation is performed on the erased word-line, the horizontal axis indicates a threshold voltage "Vth", and the vertical axis indicates the number of memory cells. For example, the memory cell may have an erased state E.

A reference numeral 33 corresponds to a memory cell distribution after the pre-program operation is performed on the erased word-line. For example, the memory cell may have an erased state E shifted toward in a positive direction.

A reference numeral 35 corresponds to a memory cell distribution when the erase operation is performed after the pre-program operation is performed on the erased word-line. For example, the memory cell may have an erased state E.

A reference numeral 37 corresponds to a memory cell distribution when the a program operation is performed on the erased word-line. For example, the memory cell may have an erased state E shifted toward in a positive direction. When the memory cell is a triple-level cell which is programmed by three bits, the memory cell may be in one of an erased state E, a first program state P1, a second program state P2, a third program state P3, a fourth program state P4, a fifth program state P5, a sixth program state P6 and a seventh program state P7.

In each of the reference numerals 31, 33, 35 and 37, a dotted line indicates an over-erased state in which a memory cell distribution of the erased state is shifted in a negative direction due to repetitive erase operation. The memory cell may be prevented from being over-erased by increasing a voltage level of the pre-program voltage applied to the erased word-line.

Figure 12:
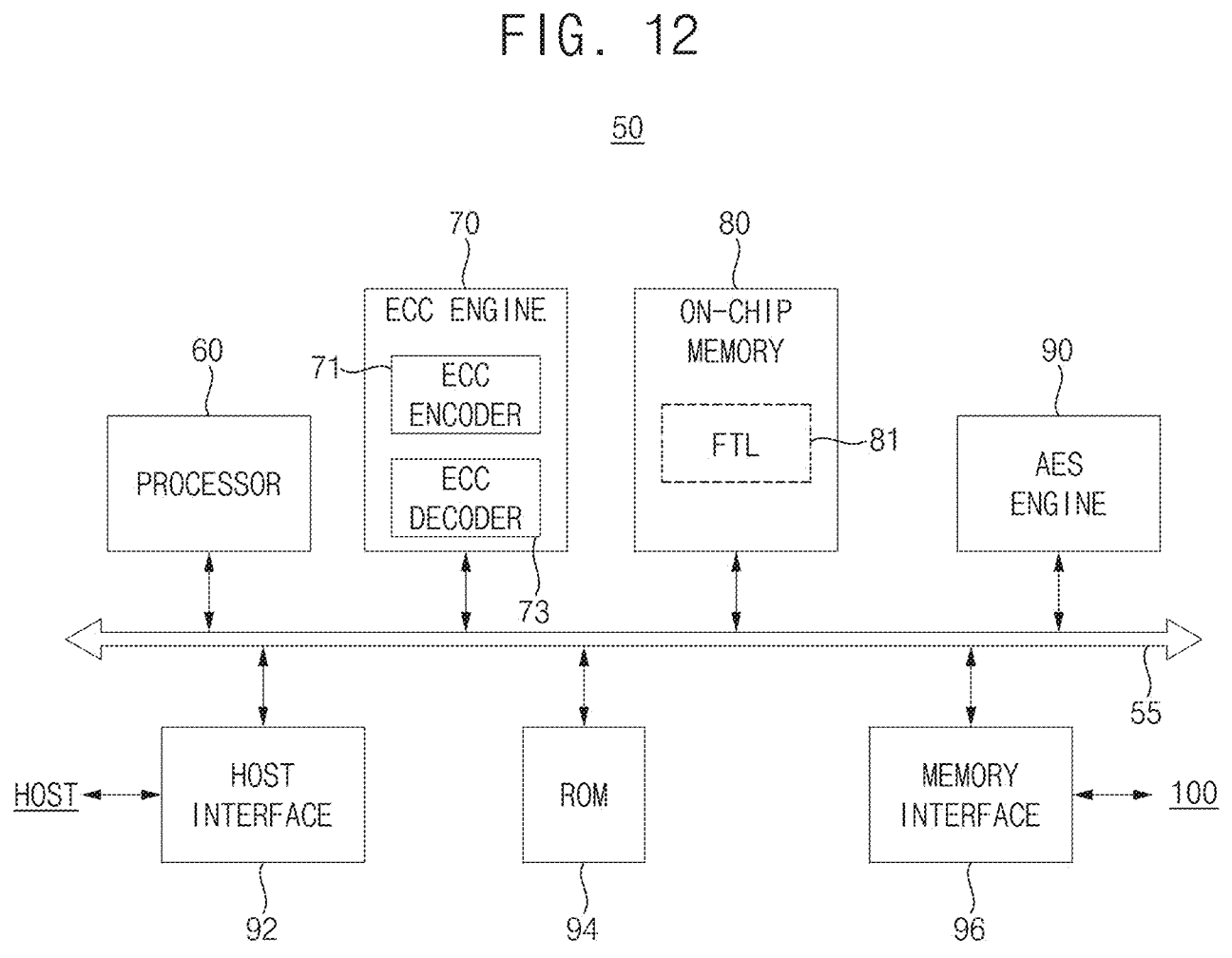

FIG. 12 is a block diagram illustrating an example of the memory controller in the memory system of FIG. 9.

Referring to FIG. 12, the memory controller 50 may include a processor 60, an error correction code (ECC) engine 70, an on-chip memory 80, an advanced encryption standard (AES) engine 90, a host interface 92, a ROM 94 and a memory interface 96 which are connected via a bus 55.

The processor 60 may control an overall operation of the memory controller 50. The processor 60 may control the ECC engine 70, the on-chip memory 80, the AES engine 90, the host interface 92, the ROM 94 and the memory interface 96. The processor 60 may include one or more cores (e.g., a homogeneous multi-core or a heterogeneous multi-core). The processor 60 may be or include, for example, at least one of a central processing unit (CPU), an image signal processing unit (ISP), a digital signal processing unit (DSP), a graphics processing unit (GPU), a vision processing unit (VPU), and a neural processing unit (NPU). The processor 60 may execute various application programs (e.g., a flash translation layer (FTL) 81 and firmware) loaded onto the on-chip memory 80.

The on-chip memory 80 may store various application programs that are executable by the processor 60. The on-chip memory 80 may operate as a cache memory adjacent to the processor 60. The on-chip memory 80 may store a command, an address, and data to be processed by the processor 60 or may store a processing result of the processor 60. The on-chip memory 80 may be, for example, a storage medium or a working memory including a latch, a register, a static random access memory (SRAM), a dynamic random access memory (DRAM), a thyristor random access memory (TRAM), a tightly coupled memory (TCM), etc.

The processor 60 may execute the FTL 81 loaded onto the on-chip memory 80. The FTL 81 may be loaded onto the on-chip memory 80 as firmware or a program stored in the nonvolatile memory device 100. The FTL 81 may manage mapping between a logical address provided from a host and a physical address of the nonvolatile memory device 100 and may include an address mapping table manager managing and updating an address mapping table. The FTL 81 may further perform a garbage collection operation, a wear leveling operation, and the like, as well as the address mapping described above. The FTL 81 may be executed by the processor 60 for addressing one or more of the following aspects of the nonvolatile memory device 100: overwrite- or in-place write-impossible, a life time of a memory cell, a limited number of program-erase (PE) cycles, and an erase speed slower than a write speed. The FTL 81 may provide the nonvolatile memory device 100 mapping information between the logical address and the physical address as the status information (STI in FIG. 9).

Memory cells of the nonvolatile memory device 100 may have the physical characteristic that a threshold voltage distribution varies due to causes, such as a program elapsed time, a temperature, program disturbance, read disturbance and etc. For example, data stored at the nonvolatile memory device 100 becomes erroneous due to the above causes.

The memory controller 50 may utilize a variety of error correction techniques to correct such errors. For example, the memory controller 50 may include the ECC engine 70.

The ECC engine 70 may correct errors which occur in the data stored in the nonvolatile memory device 100. The ECC engine 70 may include an ECC encoder 71 and an ECC decoder 73. The ECC encoder 71 may perform an ECC encoding operation on data to be stored in the nonvolatile memory device 100. The ECC decoder 73 may perform an ECC decoding operation on data read from the nonvolatile memory device 100.

The ROM 94 may store a variety of information, needed for the memory controller 50 to operate, in firmware.

The AES engine 90 may perform at least one of an encryption operation and a decryption operation on data input to the memory controller 50 by using a symmetric-key algorithm. Although not illustrated in detail, the AES engine 90 may include an encryption module and a decryption module. For example, the encryption module and the decryption module may be implemented as separate modules. For another example, one module capable of performing both encryption and decryption operations may be implemented in the AES engine 90.

The memory controller 50 may communicate with the host through the host interface 92. For example, the host interface 92 may include Universal Serial Bus (USB), Multimedia Card (MMC), embedded-MMC, peripheral component interconnection (PCI), PCI-express, Advanced Technology Attachment (ATA), Serial-ATA, Parallel-ATA, small computer small interface (SCSI), enhanced small disk interface (ESDI), Integrated Drive Electronics (IDE), Mobile Industry Processor Interface (MIPI), Nonvolatile memory express (NVMe), Universal Flash Storage (UFS), and etc. The memory controller 50 may communicate with the nonvolatile memory device 100 through the memory interface 96.

Figure 13:
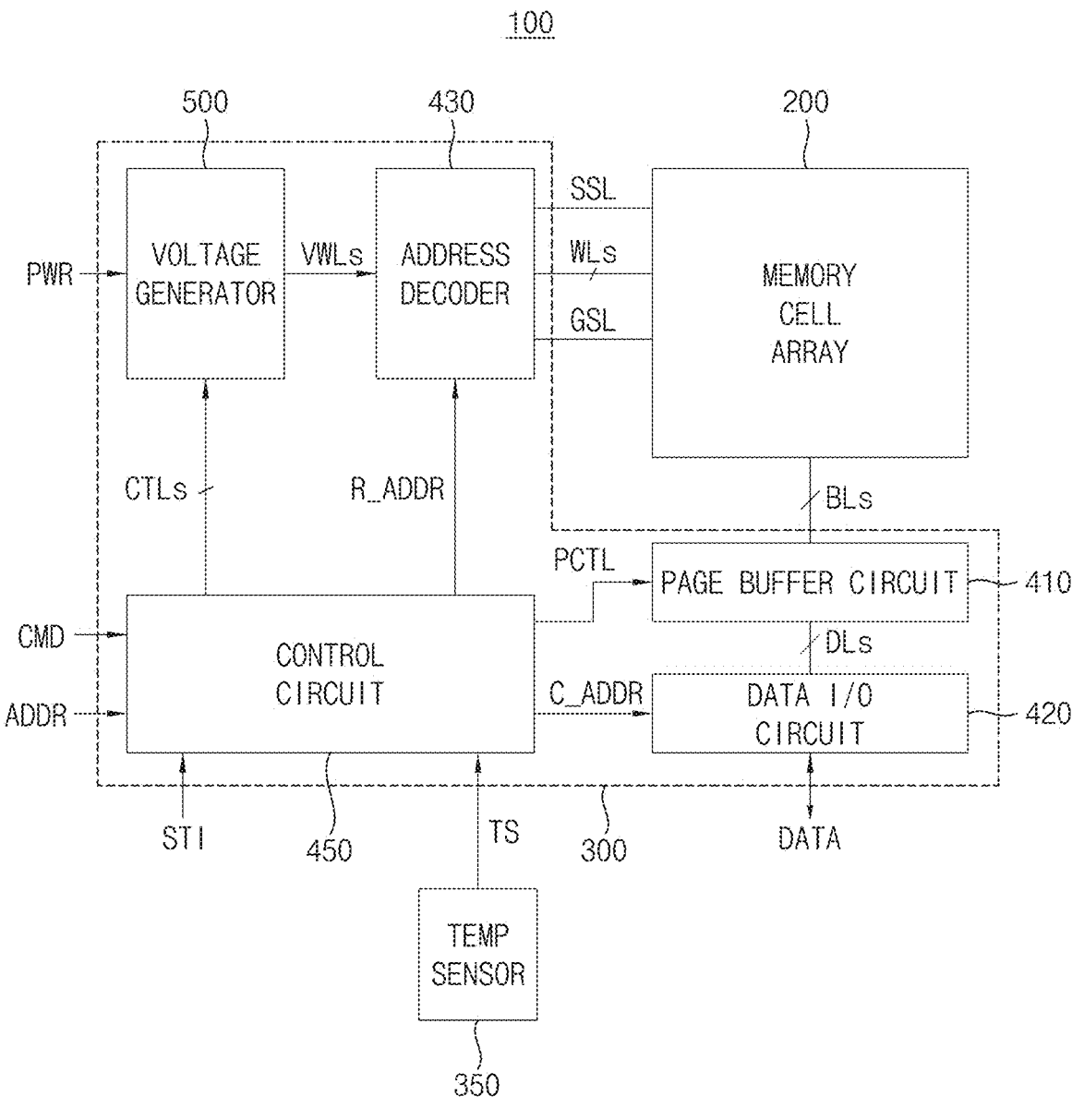
FIG. 13 is a block diagram illustrating an example of the nonvolatile memory device in the memory system of FIG. 9.

FIG. 13 is a block diagram illustrating an example of the nonvolatile memory device in the memory system of FIG. 9.

Referring to FIG. 13, the nonvolatile memory device 100 may include a memory cell array 200 and a peripheral circuit 300. The peripheral circuit 300 may include an address decoder 430, a page buffer circuit 410, a data input/output (I/O) circuit 420, a control circuit 450 and a voltage generator 500. In some implementations, the nonvolatile memory device 100 may further include a temperature (TEMP) sensor 350. The temperature sensor 350 may be included in the peripheral circuit 300. The temperature sensor 350 may be disposed at an outside of the peripheral circuit 300.

The memory cell array 200 may be coupled to the address decoder 430 through a string selection line SSL, a plurality of word-lines WLs, and a ground selection line GSL. In addition, the memory cell array 200 may be coupled to the page buffer circuit 410 through a plurality of bit-lines BLs. The memory cell array 200 may include a plurality of nonvolatile memory cells coupled to the plurality of word-lines WLs and the plurality of bit-lines BLs.

In some implementations, the memory cell array 200 may be a three-dimensional memory cell array, which is formed on a substrate in a three-dimensional structure (or a vertical structure). In this case, the memory cell array 200 may include vertical cell strings that are vertically oriented such that at least one memory cell is located over another memory cell.

The control circuit 450 may receive the command (signal) CMD and the address (signal) ADDR from the memory controller 50 and control an erase loop, a program loop and a read operation of the nonvolatile memory device 100 based on the command CMD and the address ADDR. The program loop may include a program operation and a program verification operation. The erase loop may include an erase operation and an erase verification operation.

For example, the control circuit 450 may generate control signals CTLs to control the voltage generator 500 and may generate a page buffer control signal PCTL to control the page buffer circuit 410 based on the command CMD. The control circuit 450 may generate a row address R_ADDR and a column address C_ADDR based on the address ADDR. The control circuit 450 may provide the row address R_ADDR to the address decoder 430 and provide the column address C_ADDR to the data I/O circuit 420.

The address decoder 430 may be coupled to the memory cell array 200 through the string selection line SSL, the plurality of word-lines WLs, and the ground selection line GSL. During the program operation or the read operation, the address decoder 430 may determine one of the plurality of word-lines WLs as a selected word-line and determine rest of the plurality of word-lines WLs except for the selected word-line as unselected word-lines based on the row address R_ADDR.

The voltage generator 500 may generate word-line voltages VWLs, which are required for the operation of the nonvolatile memory device 100, based on the control signals CTLs. The voltage generator 500 may receive the power PWR from the memory controller 50. The word-line voltages VWLs may be applied to the plurality of word-lines WLs through the address decoder 430.

For example, during the erase operation, the voltage generator 500 may apply an erase voltage to a channel of cell strings of the memory block and may apply a ground voltage to word-lines of a memory block to be erased. During the erase verification operation, the voltage generator 500 may apply an erase verification voltage to the word-lines of the memory block to be erased or sequentially apply the erase verification voltage to word-lines on a word-line basis.

For example, during the program operation, the voltage generator 500 may apply a program voltage to the selected word-line and may apply a program pass voltage to the unselected word-lines. In addition, during the program verification operation, the voltage generator 500 may apply a program verification voltage to the selected word-line and may apply a verification pass voltage to the unselected word-lines. In addition, during the read operation, the voltage generator 500 may apply a read voltage to the selected word-line and may apply a read pass voltage to the unselected word-lines.

The page buffer circuit 410 may be coupled to the memory cell array 200 through the plurality of bit-lines BLs. The page buffer circuit 410 may include a plurality of page buffers. The page buffer circuit 410 may temporarily store data to be programmed in a selected page or data read out from the selected page.

The data I/O circuit 420 may be coupled to the page buffer circuit 410 through a plurality of data lines DLs. During the program operation, the data I/O circuit 420 may receive program data DATA from the memory controller 50 and provide the program data DATA to the page buffer circuit 410 based on the column address C_ADDR received from the control circuit 450. During the read operation, the data I/O circuit 420 may provide read data DATA, which are stored in the page buffer circuit 410, to the memory controller 50 based on the column address C_ADDR received from the control circuit 450.

The temperature sensor 350 may sense operating temperature of the nonvolatile memory device 100 and may provide the control circuit 450 with a temperature signal TS corresponding to the sensed operating temperature based on the sensed operating temperature.

Figure 14:
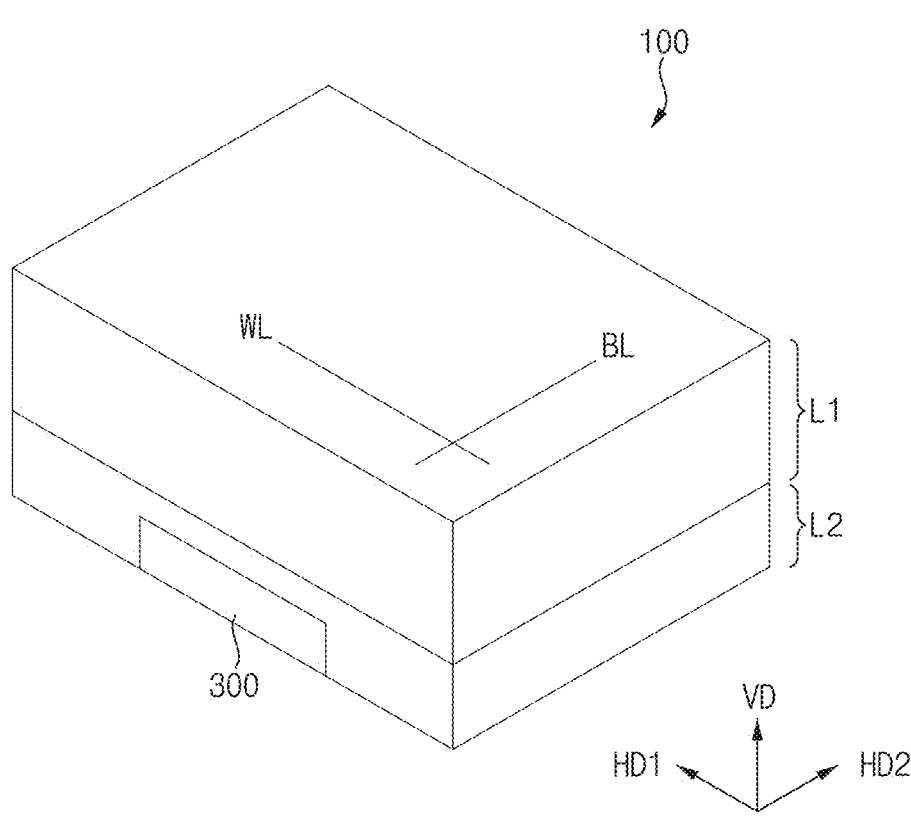
FIG. 14 schematically illustrates an example of a structure of the nonvolatile memory device of FIG. 13.

FIG. 14 schematically illustrates an example of a structure of the nonvolatile memory device of FIG. 13.

Referring to FIG. 14, the nonvolatile memory device 100 may include a first semiconductor layer L1 and a second semiconductor layer L2, and the first semiconductor layer L1 may be stacked in a vertical direction VD with respect to the second semiconductor layer L2. The second semiconductor layer L2 may be under the first semiconductor layer L1 in the vertical direction VD, and accordingly, the second semiconductor layer L2 may be close to a substrate.

In some implementations, the memory cell array 200 in FIG. 13 may be formed (or, provided) on the first semiconductor layer L1, and the peripheral circuit 300 in FIG. 13 may be formed (or, provided) on the second semiconductor layer L2. Accordingly, the nonvolatile memory device 100 may have a structure in which the memory cell array 200 is on the peripheral circuit 300, that is, a cell over periphery (COP) structure. The COP structure may effectively reduce an area in a horizontal direction and improve the degree of integration of the nonvolatile memory device 100.

In some implementations, the second semiconductor layer L2 may include the substrate, and by forming transistors on the substrate and metal patterns for wiring transistors, the peripheral circuit 300 may be formed in the second semiconductor layer L2. After the peripheral circuit 300 is formed on the second semiconductor layer L2, the first semiconductor layer L1 including the memory cell array 200 may be formed, and the metal patterns for connecting the word-lines WL and the bit-lines BL of the memory cell array 200 to the peripheral circuit 300 formed in the second semiconductor layer L2 may be formed. For example, the word-lines WL may extend in a first horizontal direction HD1 and the bit-lines BL may extend in a second horizontal direction HD2.

As the number of stages of memory cells in the memory cell array 200 increases with the development of semiconductor processes, that is, as the number of stacked word-lines WL increases, an area of the memory cell array 200 may decrease, and accordingly, an area of the peripheral circuit 300 may also be reduced. According to some implementations, to reduce an area of a region occupied by the page buffer circuit 410, the page buffer circuit 410 may have a structure in which the page buffer unit and the cache latch are separated from each other, and may connect sensing nodes included in each of the page buffer units commonly to a combined sensing node.

Figure 15:
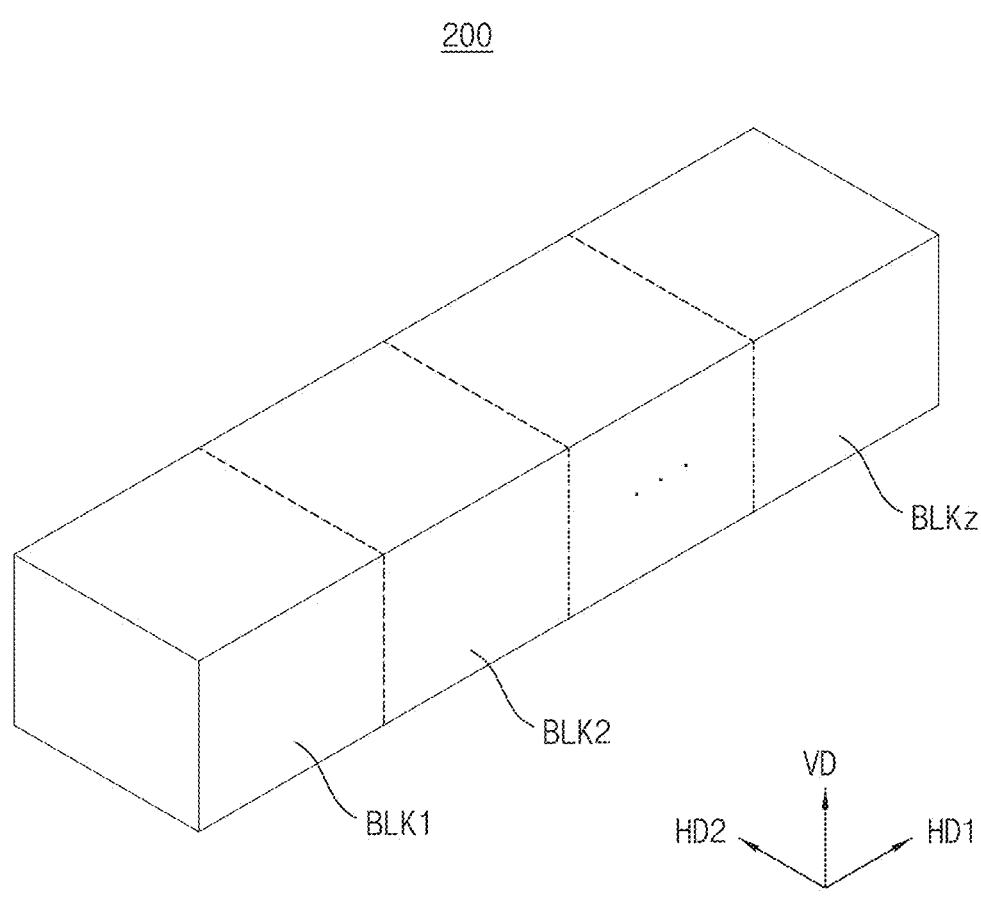
FIG. 15 is a block diagram illustrating an example of the memory cell array in the nonvolatile memory device of FIG. 13.

FIG. 15 is a block diagram illustrating an example of the memory cell array in the nonvolatile memory device of FIG. 13.

Referring to FIG. 15, the memory cell array 200 may include a plurality of memory blocks BLK1 to BLKz. Here, z is a natural number greater than two. The memory blocks BLK1 to BLKz extend along the first horizontal direction HD1, the second horizontal direction HD2, and the vertical direction VD. In some implementations, the memory blocks BLK1 to BLKz are selected by the address decoder 430 in FIG. 13. For example, the address decoder 430 may select a memory block BLK corresponding to a block address among the memory blocks BLK1 to BLKz.

The first horizontal direction HD1 and the second horizontal direction HD2 cross each other and are substantially parallel to an upper surface to a substrate and the vertical direction VD is substantially perpendicular to the upper surface of the substrate.

Figure 16:
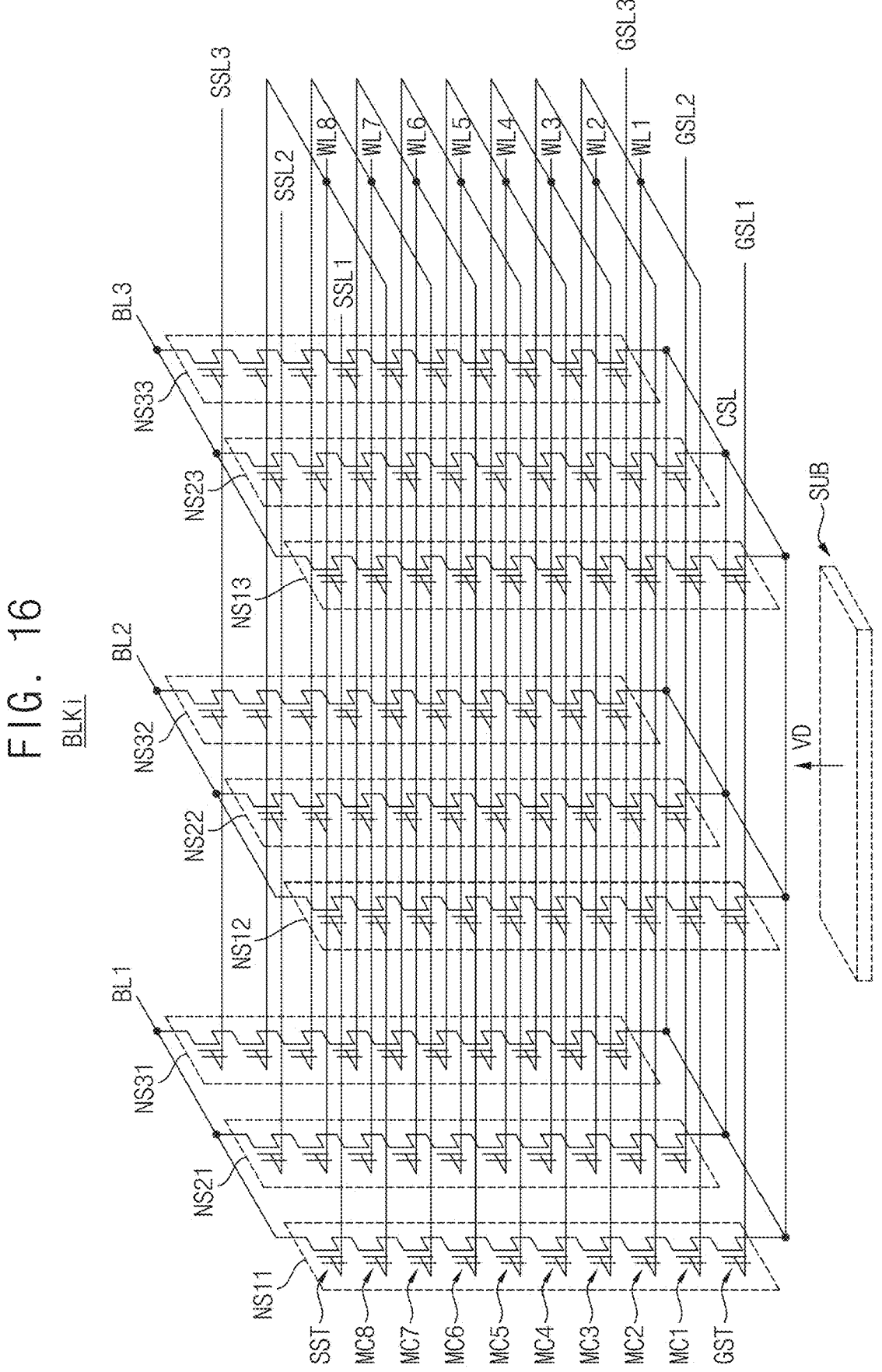
FIG. 16 is an example circuit diagram illustrating one of the memory blocks of FIG. 15.

FIG. 16 is an example circuit diagram illustrating one of the memory blocks of FIG. 15.

A memory block BLKi of FIG. 16 may be formed on a substrate SUB in a three-dimensional structure (or a vertical structure). Here, i may be one of 1 to z. For example, a plurality of cell strings included in the memory block BLKi may be formed in the vertical direction VD perpendicular to the substrate SUB.

Referring to FIG. 16, the memory block BLKi may include a plurality of (memory) cell strings NS11 to NS33 coupled between bit-lines BL1, BL2 and BL3 and a common source line CSL. Each of the cell strings NS11 to NS33 may include a string selection transistor SST, a plurality of memory cells MC1 to MC8, and a ground selection transistor GST. In FIG. 16, each of the cell strings NS11 to NS33 is illustrated to include eight memory cells MC1 to MC8. However, implementations are not limited thereto. In some implementations, each of the cell strings NS11 to NS33 may include any number of memory cells.

The string selection transistor SST may be connected to corresponding string selection lines SSL1 to SSL3. The plurality of memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL.

Word-lines (e.g., word-line WL1) having the same height may be commonly connected, and the ground selection lines GSL1 to GSL3 and the string selection lines SSL1 to SSL3 may be separated.

Figure 17A:
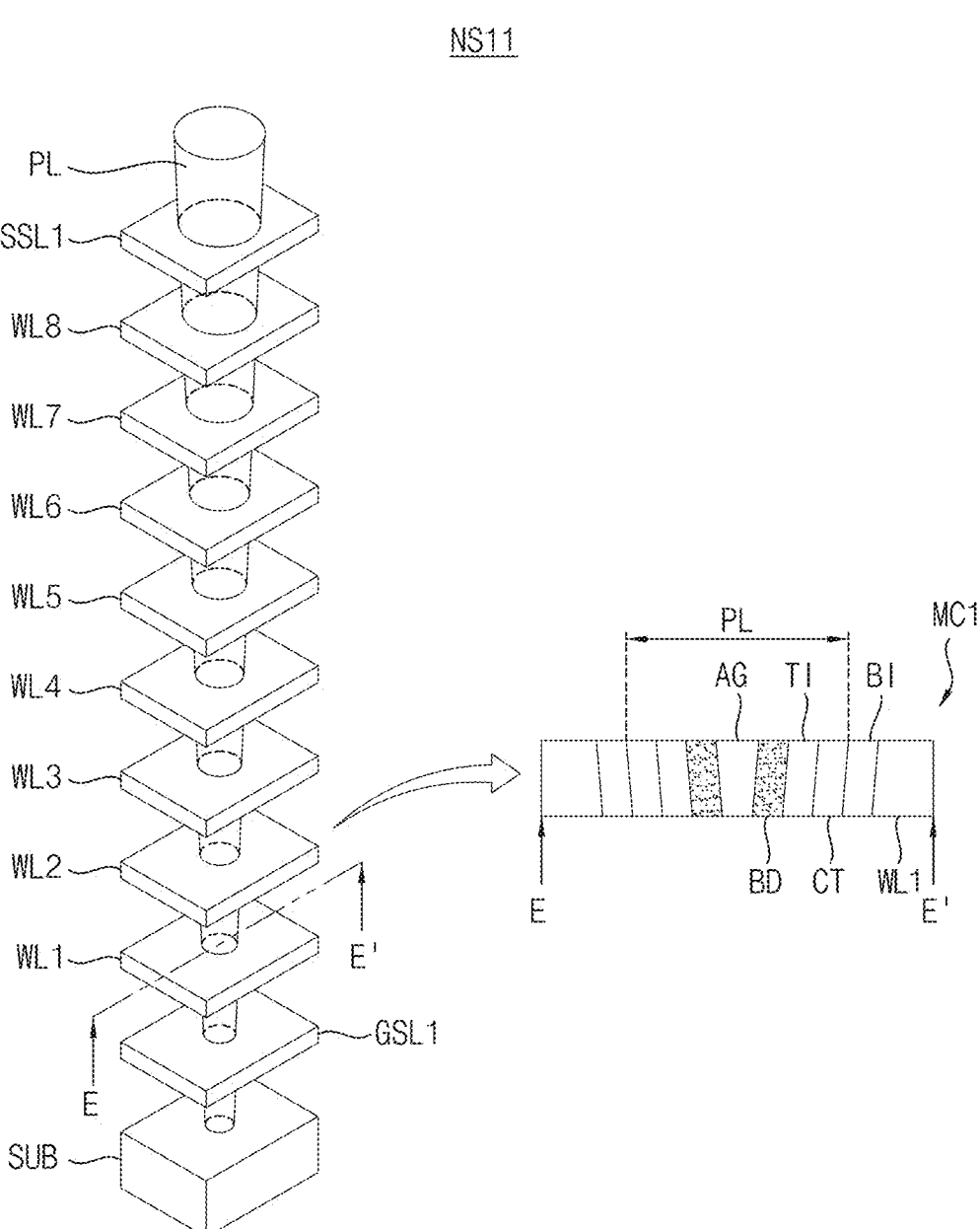
FIG. 17A illustrates an example of a structure of a cell string in the memory block of FIG. 11.

FIG. 17A illustrates an example of a structure of a cell string NS11 in the memory block of FIG. 11.

Referring to FIGS. 16 and 17A, a pillar PL is provided on the substrate SUB such that the pillar PL extends in a direction perpendicular to the substrate SUB to make contact with the substrate SUB. Each of the ground selection line GSL, the word-lines WL1 to WL8, and the string selection lines SSL illustrated in FIG. 17A may be formed of a conductive material parallel with the substrate SUB, for example, a metallic material. The pillar PL may be in contact with the substrate SUB through the conductive materials forming the string selection lines SSL, the word-lines WL1 to WL8, and the ground selection line GSL.

A sectional view taken along a line E-E' is also illustrated in FIG. 17A. In some implementations, a sectional view of a first memory cell MC1 corresponding to a first word-line WL1 is illustrated. The pillar PL may include a cylindrical body BD. An air gap AG may be defined in the interior of the body BD.

The body BD may include P-type silicon and may be an area where a channel will be formed. The pillar PL may further include a cylindrical tunnel insulating layer TI surrounding the body BD and a cylindrical charge trap layer CT surrounding the tunnel insulating layer TI. A blocking insulating layer BI may be provided between the first word-line WL1 and the pillar PL. The body BD, the tunnel insulating layer TI, the charge trap layer CT, the blocking insulating layer BI, and the first word-line WL1 may constitute or be included in a charge trap type transistor that is formed in a direction perpendicular to the substrate SUB or to an upper surface of the substrate SUB. A string selection transistor SST, a ground selection transistor GST, and other memory cells may have the same structure as the first memory cell MC1.

Figure 17B:
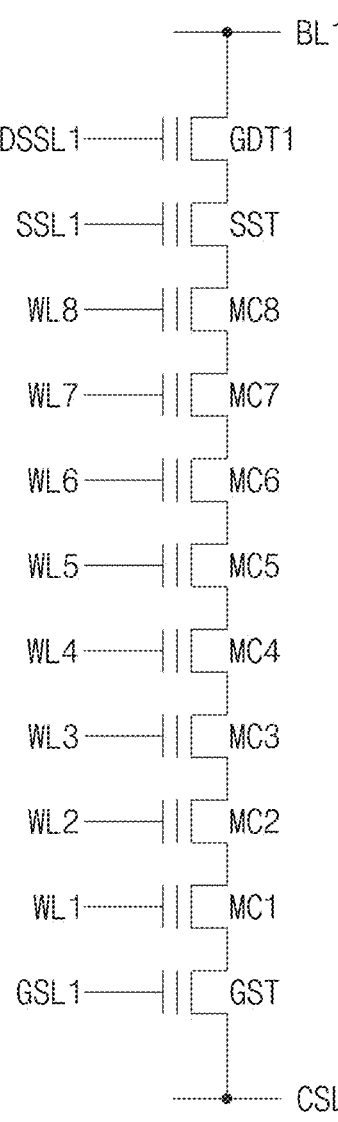
FIGS. 17B through 17D illustrate examples of one of cell strings in FIG. 16, respectively.
Figure 17C:
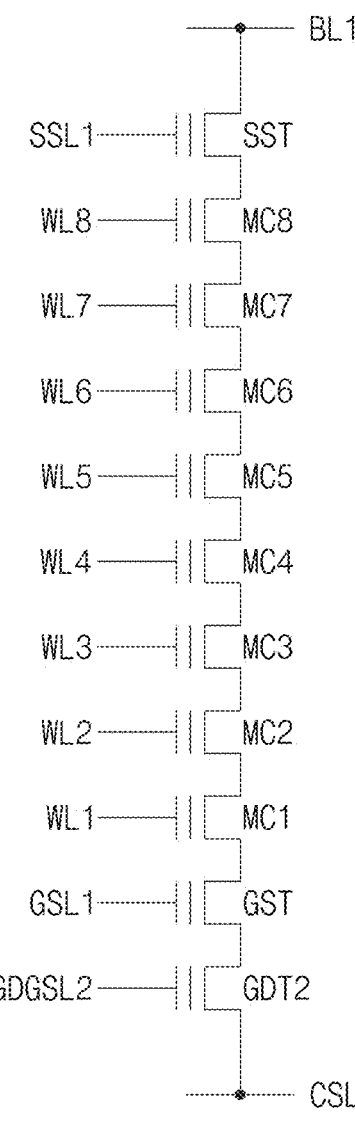
Figure 17D:
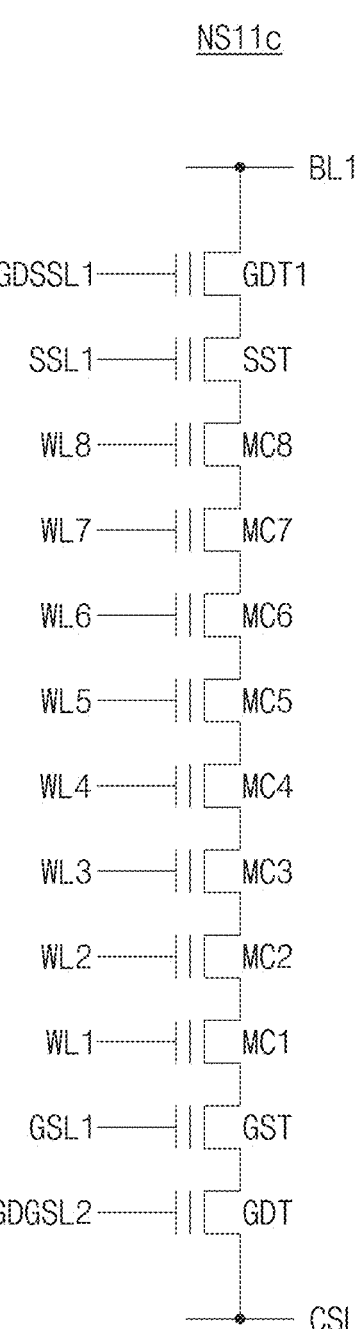

FIGS. 17B through 17D illustrate examples of one of cell strings in FIG. 16, respectively.

Referring to FIG. 17B, a cell string NS11a may include a ground selection transistor GST, a plurality of memory cells MC1 to MC8, a string selection transistor SST and a GIDL string selection transistor GDT1 connected in series between the common source line CSL and the bit-line BL1.

The GIDL string selection transistor GDT1 may be coupled to a GIDL string selection line GDSSL1. In this case, a uni-directional channel precharge may be performed in each of the cell strings during the bit-line set-up period PBLS, by applying a GIDL drain voltage to all or some of the plurality of bit-lines such that the GIDL drain voltage has a voltage level higher than a voltage difference between a GIDL threshold voltage and a GIDL on voltage during the bit-line set-up period PBLS. The GIDL on voltage correspond to a voltage having a level to turn-on the GIDL string selection transistor GDT1. Each of the cell strings NS11 to NS33 in FIG. 16 may employ the cell string NS11a of FIG. 17B.

Referring to FIG. 17C, a cell string NS11b may include a GIDL ground selection transistor GDT2, a ground selection transistor GST, a plurality of memory cells MC1 to MC8 and a string selection transistor SST connected in series between the common source line CSL and the bit-line BL1. The GIDL ground selection transistor GDT2 may be coupled to a GIDL ground selection line GDGSL2. In this case, a uni-directional channel precharge may be performed in each of the cell strings during the bit-line set-up period PBLS, by applying a GIDL drain voltage to the common source line CSL. Each of the cell strings NS11 to NS33 in FIG. 16 may employ the cell string NS11b of FIG. 17C.

Referring to FIG. 17D, a cell string NS11c may include a GIDL ground selection transistor GDT2, a ground selection transistor GST, a plurality of memory cells MC1 to MC8, a string selection transistor SST and a GIDL string selection transistor GDT1 connected in series between the common source line CSL and the bit-line BL1. The GIDL ground selection transistor GDT2 may be coupled to a GIDL ground selection line GDGSL2 and the GIDL string selection transistor GDT1 may be coupled to a GIDL string selection line GDSSL1. In this case, a bi-directional channel precharge may be performed in each of the cell strings during the bit-line set-up period PBLS, by applying the GIDL drain voltage to at least a portion of the plurality of bit-lines and applying the GIDL drain voltage to common the source line CSL. Each of the cell strings NS11 to NS33 in FIG. 16 may employ the cell string NS11c of FIG. 17D.

Figure 18:
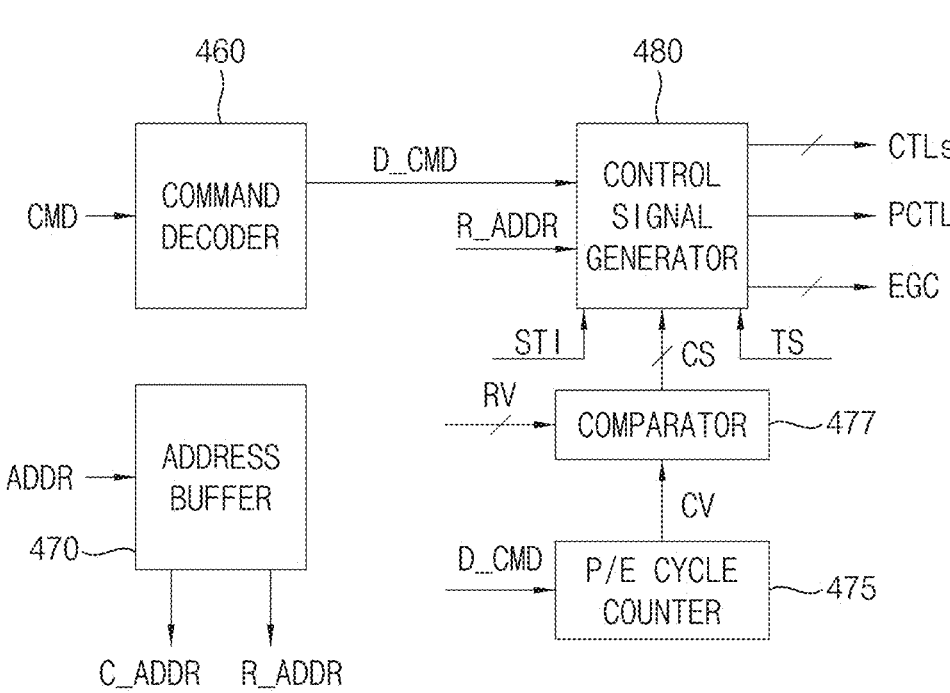
FIG. 18 is a block diagram illustrating an example of the control circuit in the nonvolatile memory device of FIG. 13.

FIG. 18 is a block diagram illustrating an example of the control circuit in the nonvolatile memory device of FIG. 13.

Referring to FIG. 18, the control circuit 450 may include a command decoder 460, an address buffer 470, a program/erase P/E cycle counter 475, a comparator 477 and a control signal generator 480.

The command decoder 460 may decode the command CMD and may provide a decoded command D_CMD to the control signal generator 480. When the decoded command D_CMD designates the program operation or the erase operation, the command decoder 460 may provide the decoded command D_CMD to the program/erase cycle counter 475.

The address buffer 470 may receive the address (signal) ADDR, provide the row address R_ADDR to the address decoder 430 and the control signal generator 480, and provide the column address C_ADDR to the data I/O circuit 420.

The program/erase cycle counter 475 may count program/erase cycle of each of the memory blocks based on the decoded command D_CMD and mat provide a counted value CV to the comparator 477.

The comparator 477 may compare the counted value CV with one or more reference values RV and may provide the control signal generator 480 with a comparison signal CS indicating a result of the comparison.

Figure 27:
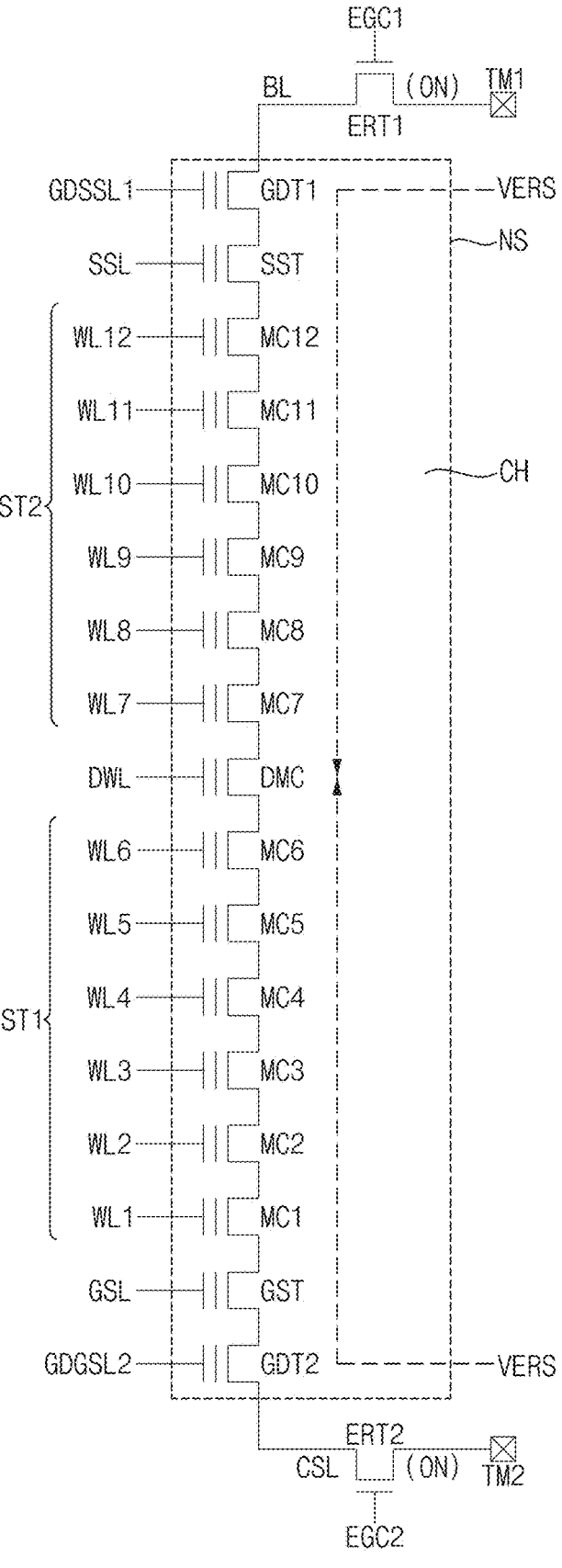
FIG. 27 illustrates an example of an erase operation performed on a cell string of FIG. 25.

The control signal generator 480 may receive the decoded command D_CMD, the status information STI, the comparison signal CS, the temperature signal TS and the row address R_ADDR, may generate the control signals CTLs based on an operation directed by the decoded command D_CMD and at least one of the status information STI, the comparison signal CS, the temperature signal TS and the row address R_ADDR, may provide the control signals CTLs to the voltage generator 500, may generate the page buffer control signal PCTL, may provide the page buffer control signal PCTL to the page buffer circuit 410, may generate an erase control signal EGC and may provide an erase control signal EGC to erase transistors (ERT1 and ERT2 in FIG. 27).

When the decoded command D_CMD designates the erase operation, the control signal generator 480 may determine whether the target memory block is an open block based on the status information STI. In response to the target memory block is an open block, the control signal generator 480 may generate the control signals CTLs such that the second voltage level of the pre-program voltage is increased as an increase of the program/erase cycles, based on the comparison signal CS.

When the decoded command D_CMD designates the erase operation, the control signal generator 480 may determine whether the target memory block is an open block based on the status information STI. In response to the target memory block is an open block, the control signal generator 480 may generate the control signals CTLs such that the second voltage level of the pre-program voltage is decreased as an increase of the operating temperature of the nonvolatile memory device 100, based on the temperature signal TS.

When the decoded command D_CMD designates the erase operation, the control signal generator 480 may determine whether the target memory block is an open block based on the status information STI. In response to the target memory block is an open block, the control signal generator 480 may generate the control signals CTLs such that the second voltage level of the pre-program voltage is increased as an increase of a distance to a target region including at least one erased word-line from a common source line, based on the row address R_ADDR.

Figure 19:
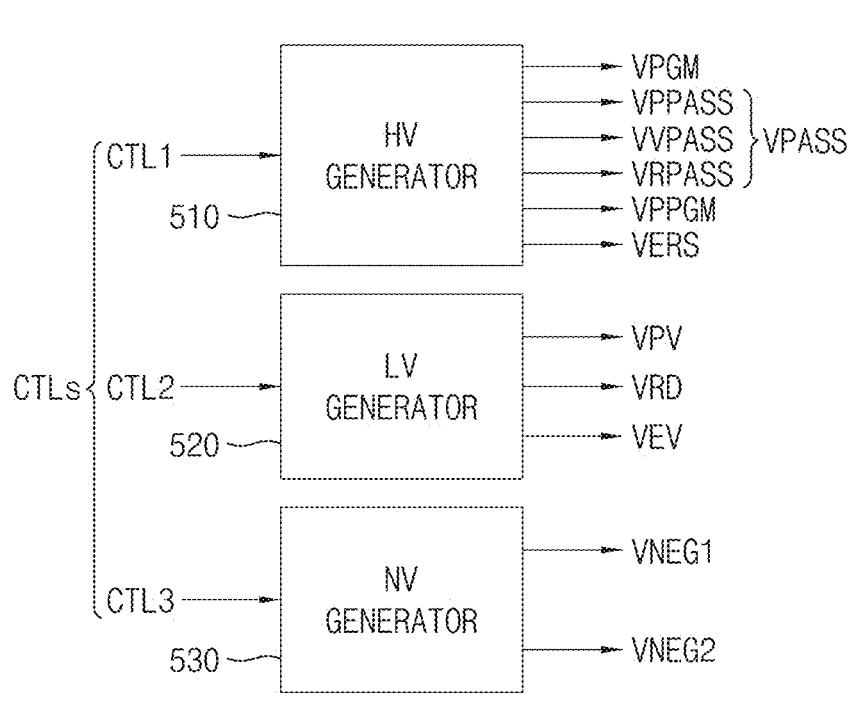
FIG. 19 is a block diagram illustrating an example of the voltage generator in the nonvolatile memory device of FIG. 13.

FIG. 19 is a block diagram illustrating an example of the voltage generator in the nonvolatile memory device of FIG. 13.

Referring to FIG. 19, the voltage generator 500 may include a high voltage HV generator 510 and a low voltage LV generator 520. The voltage generator 500 may further include a negative voltage NV generator 530.

The high voltage generator 510 may generate a program voltage PGM, a program pass voltage VPPASS, a verification pass voltage VVPASS, a read pass voltage VRPASS, a pre-program voltage VPPGM and an erase voltage VERS according to operations directed by the command CMD, in response to a first control signal CTL1. The program pass voltage VPPASS, the verification pass voltage VVPASS and the read pass voltage VRPASS may be included in the pass voltage VPASS.

The program voltage VPGM may be applied to the selected word-line, the program pass voltage VPPASS, the verification pass voltage VVPASS, the read pass voltage VRPASS may be applied to the unselected word-lines, the pre-program voltage VPPGM may be applied to the word-lines of the target memory block and the erase voltage VERS may be applied to a channel through erase transistors (ERT1 and ERT2 in FIG. 27). The first control signal CTL1 may include a plurality of bits which indicate the operations directed by the decoded command D_CMD.

The low voltage generator 520 may generate a program verification voltage VPV, an erase verification voltage VER, a read voltage VRD and erase verification voltage VEV according to operations directed by the command CMD, in response to a second control signal CTL2.

The program verification voltage VPV, the read voltage VRD, and erase verification voltage VEV may be applied to the word-lines of the target memory block. The second control signal CTL2 may include a plurality of bits which indicate the operations directed by the decode command D_CMD.

The negative voltage generator 530 may generate a first negative voltage VNEG1 and a second negative voltage VNEG2 which have negative levels according to operations directed by the command CMD, in response to a third control signal CTL3. The third control signal CTL3 may include a plurality of bits which indicate the operations directed by the decoded command D_CMD. The first negative voltage VNEG1 and the second negative voltage VNEG2 may be used for the program operation.

Therefore, the control circuit 450 in FIG. 13 may control the address decoder 430 and the voltage generator 500 to control an erase operation on the target memory block by determining whether the target memory block is an open block including at least one erased word-line, applying a pre-program voltage having a first voltage level to word-lines of the target memory block during pre-program period of a erase loop, in response to the target memory block being a closed block including only programmed word-lines and applying a pre-program voltage having a second voltage level greater than the first voltage level to a portion of a region including the at least one erased word-line, of the target memory block during the pre-program period, in response to the target memory block being the open block.

Figure 20:
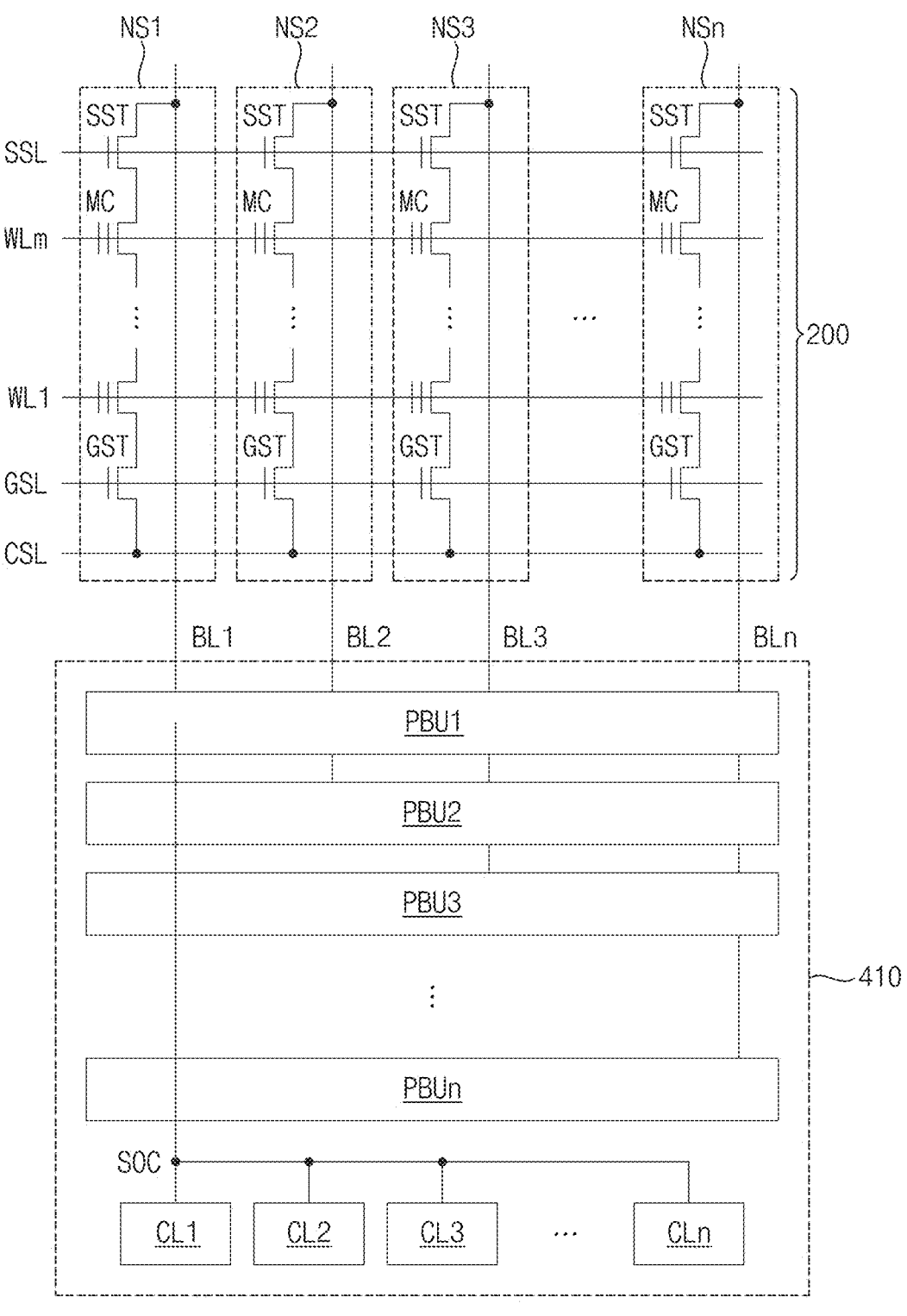
FIG. 20 is a schematic diagram of an example of a connection of the memory cell array to the page buffer circuit in FIG. 13.

FIG. 20 is a schematic diagram of an example of a connection of the memory cell array to the page buffer circuit in FIG. 13.

Referring to FIG. 20, the memory cell array 200 may include first through n-th cell strings NS1, NS2, NS3, ..., NSn, each of the first through n-th cell strings NS1, NS2, NS3, ..., NSn may include a ground select transistor GST connected to the ground select line GSL, a plurality of memory cells MC respectively connected to the first through m-th word-lines WL1, ..., WLm, and a string select transistor SST connected to the string select line SSL, and the ground select transistor GST, the plurality of memory cells MC, and the string select transistor SST may be connected to each other in series. In this case, m may be a positive integer greater than one.

The page buffer circuit 410 may include first through n-th page buffer units PBU1, PBU2, PBU3, ..., PBUn. The first page buffer unit PB1 may be connected to the first cell string NS1 via the first bit-line BL1, and the n-th page buffer unit PBUn may be connected to the n-th cell string NSn via the n-th bit-line BLn. In this case, n may be a positive integer. For example, n may be 8, and the page buffer circuit 410 may have a structure in which page buffer units of eight stages, or, the first through n-th page buffer units PBU1, PBU2, PBU3, ..., PBUn are in a line. For example, the first through n-th page buffer units PBU1, PBU2, PBU3, ..., PBUn may be in a row in an extension direction of the first through n-th bit-lines BL1 through BLn.

The page buffer circuit 410 may further include first through n-th cache latches CL1, CL2, CL3, ..., CLn respectively corresponding to the first through n-th page buffer units PBU1, PBU2, PBU3, ..., PBUn. For example, the page buffer circuit 410 may have a structure in which the cache latches of eight stages or the first through n-th cache latches CL1, CL2, CL3, ..., CLn in a line. For example, the first through n-th cache latches CL1, CL2, CL3, ..., CLn may be in a row in an extension direction of the first through n-th bit-lines BL1, BL2, BL3, ..., BLn.

The sensing nodes of each of the first through n-th page buffer units PBU1, PBU2, PBU3, ..., PBUn may be commonly connected to a combined sensing node SOC. In addition, the first through n-th cache latches CL1, CL2, CL3, ..., CLn may be commonly connected to the combined sensing node SOC. Accordingly, the first through n-th page buffer units PBU1 through PBUn may be connected to the first through n-th cache latches CL1, CL2, CL3, ..., CLn via the combined sensing node SOC.

Figure 21B:
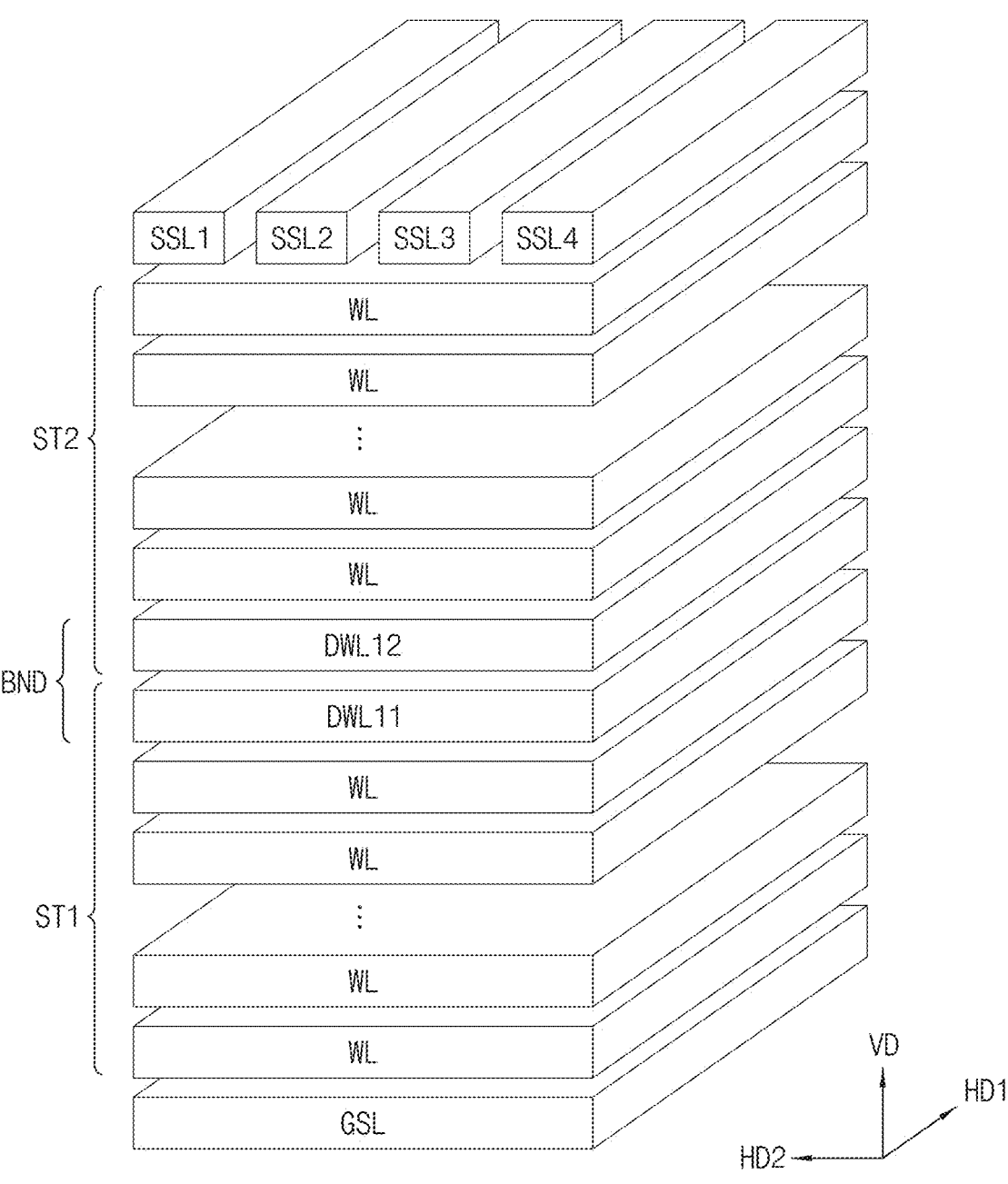
FIG. 21B is a perspective view illustrating an example of a memory block corresponding to a structure of FIG. 21A.

FIG. 21A is a circuit diagram illustrating an example of a structure of a memory cell array, and FIG. 21B is a perspective view illustrating an example of a memory block corresponding to a structure of FIG. 21A.

FIG. 21A illustrates two-dimensional version of a memory block including cell strings connected to one bit-line BL and one source line CSL for convenience of illustration, but it will be understood that the memory block may have a three-dimensional structure of a plurality of bit-lines as described with reference to FIGS. 15 and 16.

Referring to FIGS. 21A and 21B, a memory block may include a plurality of cell strings NS1, NS2, ..., NSn connected between a bit-line BL and a common source line CSL. The cell strings NS1, NS2, ..., NSn may include string selection transistors SST1, SST2, ..., SSTn controlled by string selection lines SSL1, SSL2, ..., SSLn, memory cells controlled by word-lines WL, dummy memory cells DCM11, DCM12, ..., DCM1n controlled by a dummy word-line DWL and ground selection transistors GST1, GST2, ..., GSTn controlled by a ground selection line GSL, respectively. The plurality of cell strings NS1, NS2, ..., NSn may be divided into a first stack ST1 and a second stack ST2 along the vertical direction VD. The second stack ST2 is disposed at a higher position than the first stack ST1 in the vertical direction VD. Memory cells coupled to at least one word-line located at an edge of each of the first stack ST1 and the second stack ST2 may be dummy memory cells. The dummy memory cells may not store valid data or may store single-bit data.

The dummy memory cells DCM11, DCM12, ..., DCM1n may be included in the second stack ST2.

FIG. 21A illustrates an example implementation that the ground selection transistors GST1, GST2, ..., GSTn are connected to the same ground selection line GSL. In some implementations, the ground selection transistors are connected to the respective ground selection lines.

In some implementations, as illustrated in FIGS. 21A, a boundary portion BND may include one gate line corresponding to the dummy word-line DWL that activates simultaneously the dummy memory cells GST1, GST2, ..., GSTn connected thereto.

In some implementations, as illustrated in FIG. 21B, a boundary portion BND may include two gate lines corresponding to dummy word-lines DWL11 and DWL12. The dummy word-line DWL11 may be included in the first stack ST1 and the dummy word-line DWL12 may be included in the second stack ST2.

FIG. 22 is a cross-sectional view for describing an example of a boundary portion included in a memory block.

Referring to FIG. 22, a channel hole of each cell string may include a first sub channel hole 610 and a second sub channel hole 630. A channel hole may be referred to as a pillar. The first sub channel hole 610 may include a channel layer 611, an inner material 612 and an insulation layer 613. The second sub channel hole 630 may include a channel layer 631, an inner material 632 and an insulation layer 633. The channel layer 611 of the first sub channel hole 610 may be connected to the channel layer 631 of the second sub channel hole 630 through a P-type silicon pad SIP. The sub channel holes 610 and 630 may be formed using a stopper line GTL5 having an appropriate etch rate. For example, the stopper line GTL5 may be formed of polysilicon and the other gate lines GTL1~GTL4 and the GTL6~GTL8 may be formed of metal such as tungsten to implement the appropriate etch rate.

The above-described boundary portion BND may correspond to the stopper layer GTL5 that is used to form the plurality of sub channel holes. The cells in the stopper layer GTL5 may be improper for storing data, and the stopper layer may be used as the boundary portion BND to form the dummy memory cells. Example implementations are not limited to a boundary portion of one stopper layer, and the boundary portion may include two or more gate layers.

The dummy memory cells may be implemented with a cell type or transistor type. The cell type may include a floating gate as a flash memory cell and the transistor type may not include the floating gate.

Figure 23:
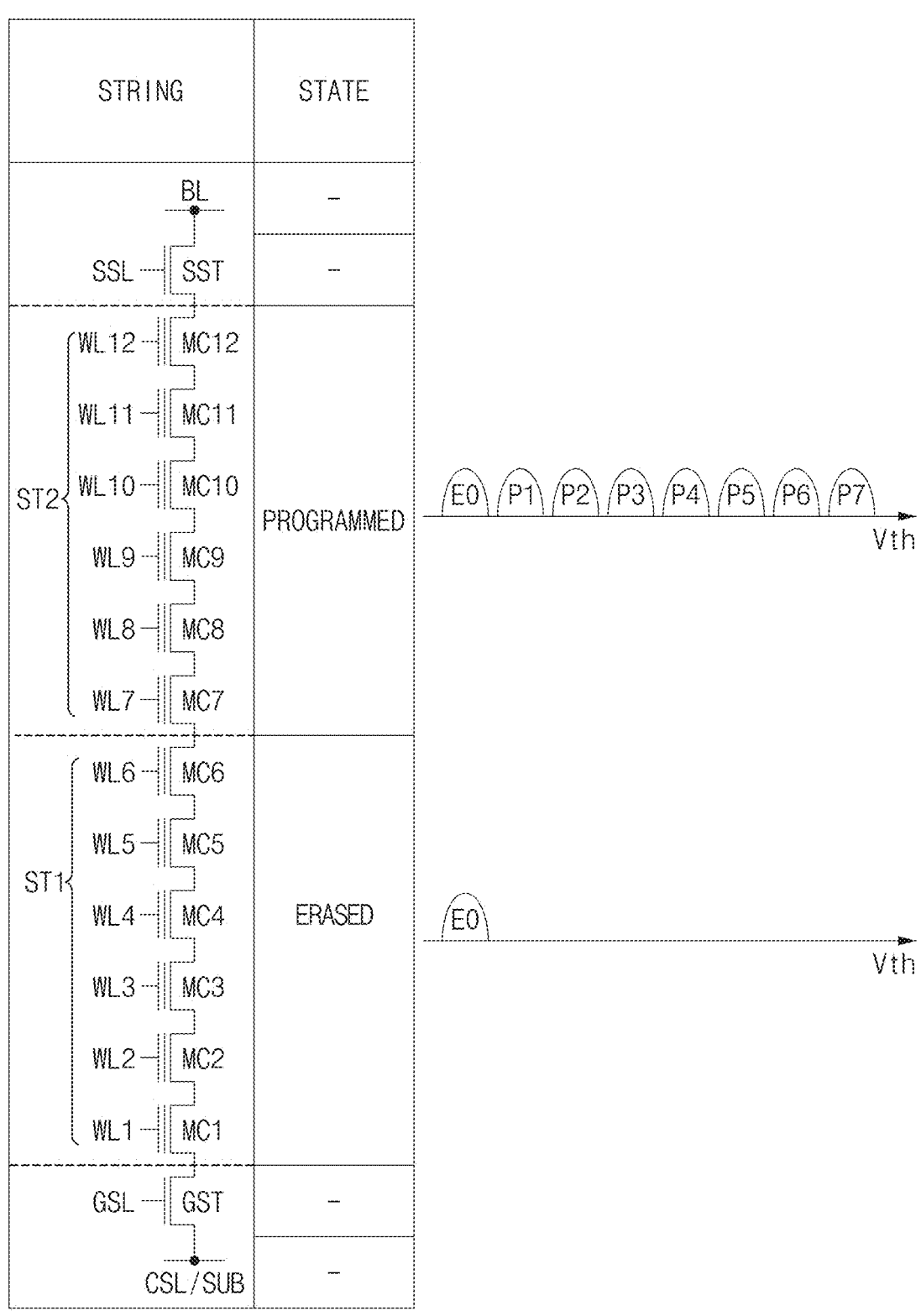
FIG. 23 is a diagram illustrating an example of a program state of an open block.

FIG. 23 is a diagram illustrating an example of a program state of an open block.

FIG. 23 illustrates one cell string including a string selection transistor SST connected to a string selection line SSL, a ground selection transistor GST connected to a ground selection line GSL and memory cells MC1~MC12 connected to word-lines WL1~WL12. The cell string is connected between a bit-line BL and a common source line CSL coupled to the substrate SUB. FIG. 23 illustrates twelve memory cells and threshold voltage distributions Vth of triple level cell (TLC) storing three bits.

Referring to FIG. 23, the cell string may be divided into a first stack ST1 and a second stack ST2 in the vertical direction.

Memory cells MC7~MC12 of the programmed word-lines in the second stack ST2 may be in one of the erased state E0 and programmed states P1, P2, P3, P4, P5, P6 and P7 and memory cells MC1~MC6 of the erased word-lines in the first stack ST1 under the second stack ST2 may be in the erased state E0.

Figure 24:
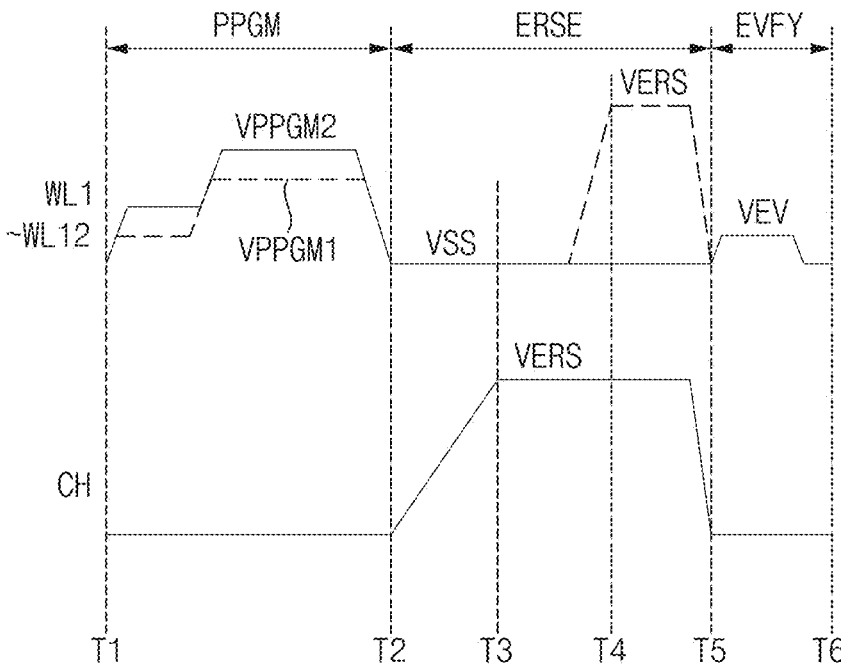
FIG. 24 is a timing diagram illustrating an example of an erase operation performed on an open block including the cell string of FIG. 23.

FIG. 24 is a timing diagram illustrating an example of an erase operation performed on an open block including the cell string of FIG. 23.

Referring to FIGS. 23 and 24, the control circuit 450 in FIG. 13 controls the address decoder 430 and the voltage generator 500 to pre-program memory cells coupled to the word-lines WL1~WL12 by applying the pre-program voltage VPPGM2 having a second voltage level greater than the pre-program voltage VPPGM1 having the first voltage level to the target memory block that is an open block during the pre-program period PPGM between the time points T1 and T2.

The control circuit 450 in FIG. 13 controls the address decoder 430 and the voltage generator 500 to apply the erase voltage VERS to the channel CH of the target memory block during the erase execution period ERSE between the time points T2 and T5. The erase voltage VERS starts to ramp at the time point T2 and arrives at a target level at the time point T3.

The control circuit 450 in FIG. 13 may erase the memory cells coupled to the word-lines WL1~WL12 of the target memory block by controlling the address decoder 430 and the voltage generator 500 to apply a word-line erase voltage having a ground voltage VSS level to the word-lines WL1~WL12 of the target memory block or to float the word-lines WL1~WL12 of the target memory block from the time point T4 during the erase execution period ERSE.

The control circuit 450 in FIG. 13 may verify the erased state of the memory cells coupled to the word-lines WL1~WL12 of the target memory block by controlling the address decoder 430 and the voltage generator 500 to apply an erase verification voltage VEV to the word-lines WL1~WL12 of the target memory block during the erase verification period EVFY between the time points T5 and T6.

FIG. 25 is an example diagram illustrating that a plurality of stacks of a target memory block are divided into a plurality of regions.

Referring to FIG. 25, a cell string of the target memory block may be divided into a first stack ST1 and a second stack ST2 in the vertical direction. The first stack ST1 may be divided into a plurality regions RG11, RG12 and RG13 based on a vertical direction from the common source line CSL and the second stack ST2 may be divided into a plurality regions RG21, RG22 and RG23 based on a vertical direction from the common source line CSL.

The region RG11 may include word-lines WL1 and WL2, the region RG12 may include word-lines WL3 and WL4, the region RG13 may include word-lines WL4 and WL5, the region RG21 may include dummy word-line DWL and word-lines WL7 and WL8, the region RG22 may include word-lines WL9 and WL10 and the region RG23 may include word-lines WL11 and WL12.

Memory cells MC4~MC12 coupled to the word-lines WL4~WL12 and a dummy memory cell DMC coupled to the dummy word-line DWL are in programmed states and memory cells MC1~MC3 coupled to the word-lines WL1~WL3 are in erased state. Therefore, each of the regions RG11 and RG12 includes at least one erased word-line and each of the regions RG13, RG21, RG22 and RG23 includes only programmed word-lines and does not include at least one erased word-line.

Although, it is illustrated as the region RG21 includes dummy word-line DWL, the region RG21 does not include dummy word-line DWL, and state of the dummy word-line DWL may not be considered for performing the erase operation.

Figure 26:
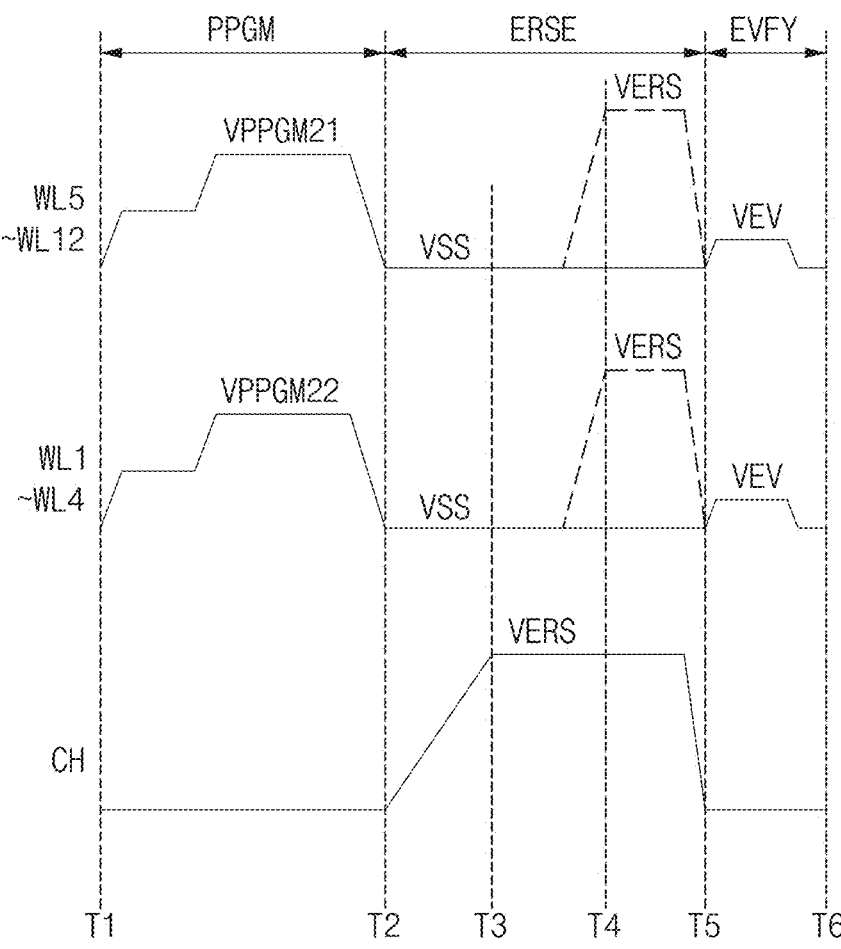
FIG. 26 is a timing diagram illustrating an example of an erase operation performed on an open block including the cell string of FIG. 25.

FIG. 26 is a timing diagram illustrating an example of an erase operation performed on an open block including the cell string of FIG. 25.

Referring to FIGS. 25 and 26, the control circuit 450 in FIG. 13 controls the address decoder 430 and the voltage generator 500 to pre-program memory cells coupled to the word-lines WL1~WL12 by applying a pre-program voltage VPPGM21 having a second voltage level to word-lines WL5~WL12 of at least a first target region not including the at least one erased word-line of the target memory block that is an open block and by applying a pre-program voltage VPPGM22 having a third voltage level greater than the second voltage level to word-lines WL1~WL4 of at least a second target region including the at least one erased word-line of the target memory block that is an open block during the pre-program period PPGM between the time points T1 and T2.

The control circuit 450 in FIG. 13 controls the address decoder 430 and the voltage generator 500 to apply the erase voltage VERS to the channel CH of the target memory block during the erase execution period ERSE between the time points T2 and T5. The erase voltage VERS starts to ramp at the time point T2 and arrives at a target level at the time point T3.

The control circuit 450 in FIG. 13 may erase the memory cells coupled to the word-lines WL1~WL12 of the target memory block by controlling the address decoder 430 and the voltage generator 500 to apply a word-line erase voltage having a ground voltage VSS level to the word-lines WL1~WL12 of the target memory block or to float the word-lines WL1~WL12 of the target memory block from the time point T4 during the erase execution period ERSE.

The control circuit 450 in FIG. 13 may verify the erased state of the memory cells coupled to the word-lines WL1~WL12 of the target memory block by controlling the address decoder 430 and the voltage generator 500 to apply an erase verification voltage VEV to the word-lines WL1~WL12 of the target memory block during the erase verification period EVFY between the time points T5 and T6.

FIG. 27 illustrates an example of an erase operation performed on a cell string of FIG. 25.

In FIG. 27, a cell string NS includes a GIDL ground selection transistor GDT2, a ground selection transistor GST, a plurality of memory cells MC1 to MC12, a string selection transistor SST and a GIDL string selection transistor GDT1 connected in series between the common source line CSL and the bit-line BL. The GIDL ground selection transistor GDT2 may be coupled to a GIDL ground selection line GDGSL2 and the GIDL string selection transistor GDT1 may be coupled to a GIDL string selection line GDSSL1. The erase transistor ERT1 may be connected between the bit-line BL and a first terminal TM1 and may have a gate receiving the erase control signal EGC1. The erase transistor ERT2 may be connected between the common source line CSL and a second terminal TM2 and may have a gate receiving the erase control signal EGC2.

In addition, the cell string NS may include the memory cells MC1~MC12 coupled to the word-lines WL1~WL12 and a dummy memory cell DMC coupled to a dummy word-line DWL connected between the ground selection transistor GST and the string selection transistor SST and may be divided into the first stack ST1 and the second stack ST2 in the vertical direction.

The control circuit 450 in FIG. 13 may erase the memory cells coupled to the word-lines WL1~WL12 of the target memory block by controlling the address decoder 430 and the voltage generator 500 to apply the erase voltage VERS to the channel CH of the target memory block through the erase transistors ERT1 and ERT2 and to float the word-lines WL1~WL12 of the target memory block from the time point during the erase execution period ERSE.

FIG. 28 illustrates an example that the control circuit adjusts a voltage level of the pre-program voltage based on program/erase cycles.

In FIG. 28, there are shown a program/erase cycle count of at least one target region including at least one erased word-line and a second voltage level of the pre-program voltage applied to the at least one target region.

Referring to FIG. 28, the control circuit 450 in FIG. 13 may control the voltage generator 500 and the address decoder 430 to adjust the second voltage level VPPGM2 of the pre-program voltage applied to the at least one target region including at least one erased word-line based on the program/erase cycle P/E CYCLE of the at least one target region. For example, the control circuit 450 in FIG. 13 controls the voltage generator 500 and the address decoder 430 to increase the second voltage level VPPGM2 of the pre-program voltage applied to the at least one target region according to an increase of the program/erase cycle P/E CYCLE.

When a counted program/erase cycle P/E CYCLE is equal to or smaller than 1000, the control circuit 450 applies a pre-program voltage VPPGM2a to the word-lines of the at least one target region. When a counted program/erase cycle P/E CYCLE is greater than 1000 and is equal to or smaller than 2000, the control circuit 450 applies a pre-program voltage VPPGM2b to the word-lines of the at least one target region. When a counted program/erase cycle P/E CYCLE is greater than 2000 and is equal to or smaller than 3000, the control circuit 450 applies a pre-program voltage VPPGM2c to the word-lines of the at least one target region.

A voltage level of the pre-program voltage VPPGM2b is greater than a voltage level of the pre-program voltage VPPGM2a and a voltage level of the pre-program voltage VPPGM2c is greater than the voltage level of the pre-program voltage VPPGM2b.

FIG. 29 illustrates an example that the control circuit adjusts a voltage level of the pre-program voltage based on an operating temperature of the nonvolatile memory device.

In FIG. 29, there are shown operating temperature of the nonvolatile memory device 100 and a second voltage level of the pre-program voltage applied to at least one target region including at least one erased word-line.

Referring to FIG. 29, the control circuit 450 in FIG. 13 may control the voltage generator 500 and the address decoder 430 to adjust the second voltage level VPPGM2 of the pre-program voltage applied to the at least one target region including at least one erased word-line based on the operating temperature of the nonvolatile memory device 100. For example, the control circuit 450 in FIG. 13 controls the voltage generator 500 and the address decoder 430 to decrease the second voltage level VPPGM2 of the pre-program voltage applied to the at least one target region according to an increase of the operating temperature of the nonvolatile memory device 100.

When an operating temperature is between −20° C. and 20° C., the control circuit 450 applies a pre-program voltage VPPGM2d to the word-lines of the at least one target region. When an operating temperature is between 20° C. and 60° C., the control circuit 450 applies a pre-program voltage VPPGM2e to the word-lines of the at least one target region. When an operating temperature is between 60° C. and 100° C., the control circuit 450 applies a pre-program voltage VPPGM2f to the word-lines of the at least one target region.

A voltage level of the pre-program voltage VPPGM2d is greater than a voltage level of the pre-program voltage VPPGM2e and a voltage level of the pre-program voltage VPPGM2e is greater than the voltage level of the pre-program voltage VPPGM2f.

FIG. 30 illustrates an example that the control circuit adjusts a voltage level of the pre-program voltage based on a distance from a common source line.

In FIG. 30, there are shown a distance to at least one target region including at least one erased word-line from the common source line in the vertical direction and a second voltage level of the pre-program voltage applied to at least one target region including at least one erased word-line.

Referring to FIG. 30, the control circuit 450 in FIG. 13 may control the voltage generator 500 and the address decoder 430 to adjust the second voltage level VPPGM2 of the pre-program voltage applied to distance to at least one target region including at least one erased word-line from the common source line in the vertical direction. For example, the control circuit 450 in FIG. 13 controls the voltage generator 500 and the address decoder 430 to increase the second voltage level VPPGM2 of the pre-program voltage applied to the at least one target region according to increase of the distance to at least one target region including at least one erased word-line from the common source line in the vertical direction.

When the distance is in a first range RNG1, the control circuit 450 applies a pre-program voltage VPPGM2$g$ to the word-lines of the at least one target region. When the distance is in a second range RNG2 greater than the first range RNG1, the control circuit 450 applies a pre-program voltage VPPGM2$h$ to the word-lines of the at least one target region. When the distance is in a third range RNG3 greater than the third range RNG3, the control circuit 450 applies a pre-program voltage VPPGM2$i$ to the word-lines of the at least one target region.

A voltage level of the pre-program voltage VPPGM2$h$ is greater than a voltage level of the pre-program voltage VPPGM2$g$ and a voltage level of the pre-program voltage VPPGM2$i$ is greater than the voltage level of the pre-program voltage VPPGM2$h$.

Figure 31:
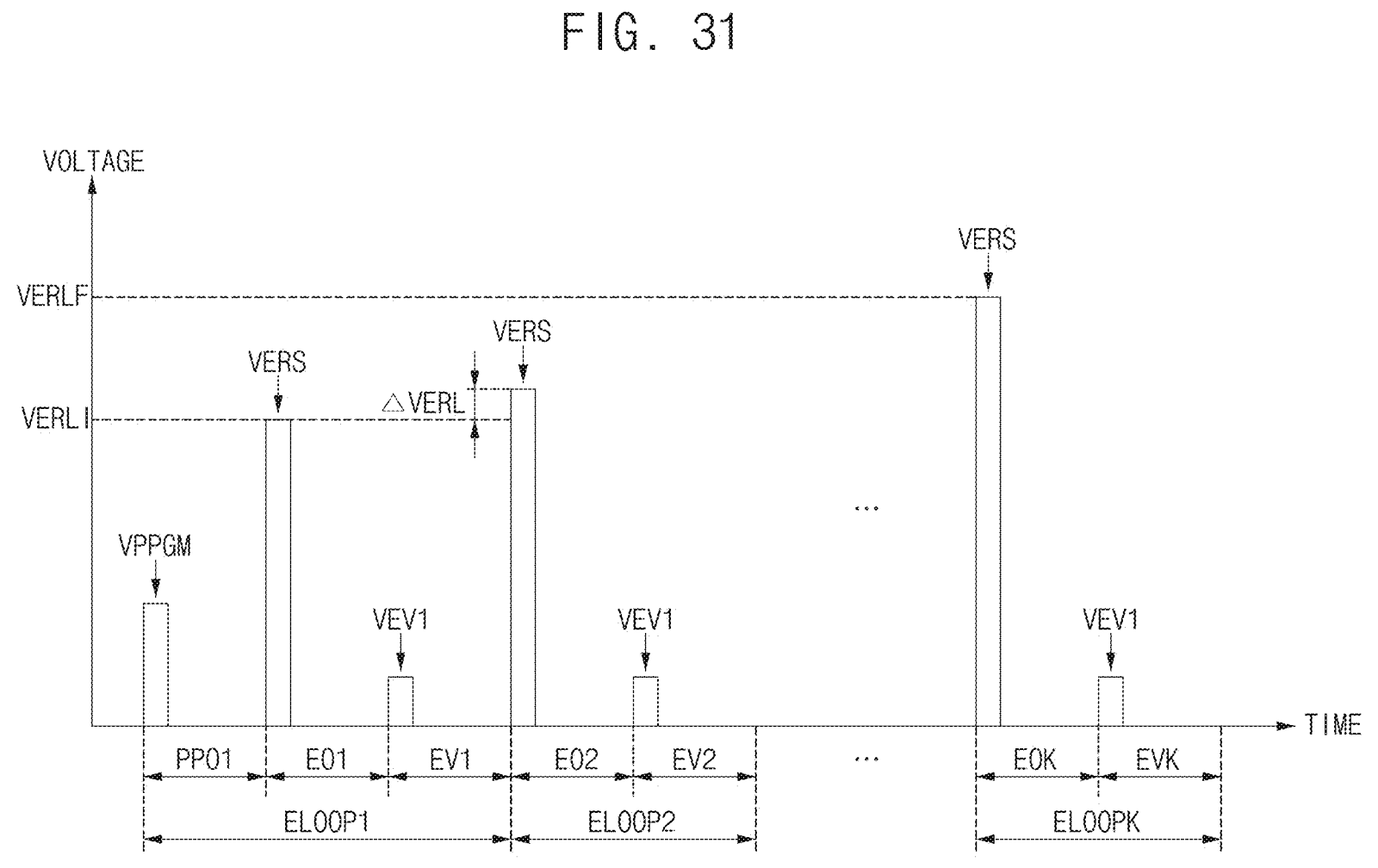

FIG. 31 illustrates an example of a plurality of erase loops performed on at least one sub-block to be erased.

Referring to FIG. 31, a plurality of erase loops ELOOP1, ELOOP2, . . . , ELOOPK may be sequentially performed, where K is a natural number greater than or equal to two. For each erase loop, one of erase operations EO1, EO2, . . . , EOK using the erase voltage VERS and a respective one of erase verification operations EV1, EV2, . . . , EVK using the erase verification voltage VEV may be sequentially performed. For the erase loop ELOOP1, a pre-program operation PPO1 using a pre-program operation PPO1 may be performed prior to the erase operation EO1.

The pre-program operation PPO1 may be performed on memory cells coupled to boundary word-lines and internal word-lines of the at least one sub-block to be erased, and a respective one of the erase verification operations EV1, EV2, . . . , EVK may be performed on the memory cells coupled to the boundary word-lines of the at least one sub-block to be erased by using the erase verification voltage VEV and on the memory cells coupled to the internal word-lines of the at least one sub-block to be erased by using the erase verification voltage VEV2, respectively.

A level of the erase voltage VERS in a current erase loop may be higher than that of the erase voltage VERS in a previous erase loop, and the erase verification voltage VEV may have a constant level (e.g., a first verification level VEVL1).

For example, in the first erase loop ELOOP1, the erase voltage VERS may have an initial erase level VERLI. In the second erase loop ELOOP2, the erase voltage VERS may have a level that is increased by a step level ΔVERL from the initial erase level VERLI. In the K-th erase loop ELOOPK which is the last erase loop, the erase voltage VERS may have a final erase level VERLF.

Although FIG. 31 illustrates that only the level of the erase voltage VERS increases as the erase loop is repeated, example implementations are not limited thereto, and the level of the erase verification voltage VEV may also increase. In some implementations, the level of the erase voltage VERS may decrease and/or the level of the erase verification voltage VEV may decrease as the erase loop is repeated. In addition, although FIG. 31 illustrates that the level of the erase voltage VERS increases by a fixed level (e.g., the step level ΔVERL), example implementations are not limited thereto, and the amount of change in the erase voltage VERS may be changed for each erase loop.

Therefore, in the nonvolatile memory device and the method of operating a nonvolatile memory device, when a target memory block to be erased is an open block including at least one erased word-line, a pre-program operation is performed on the target memory block by increasing a voltage level of a pre-program voltage applied to word-lines of the target memory block. Accordingly, even when the erase operation on the open block is repeated, the memory cells coupled to the erased word-line may be prevented from being over-erased and threshold voltage distributions of memory cells coupled to the erased word-line may be optimally maintained.

Figure 32:
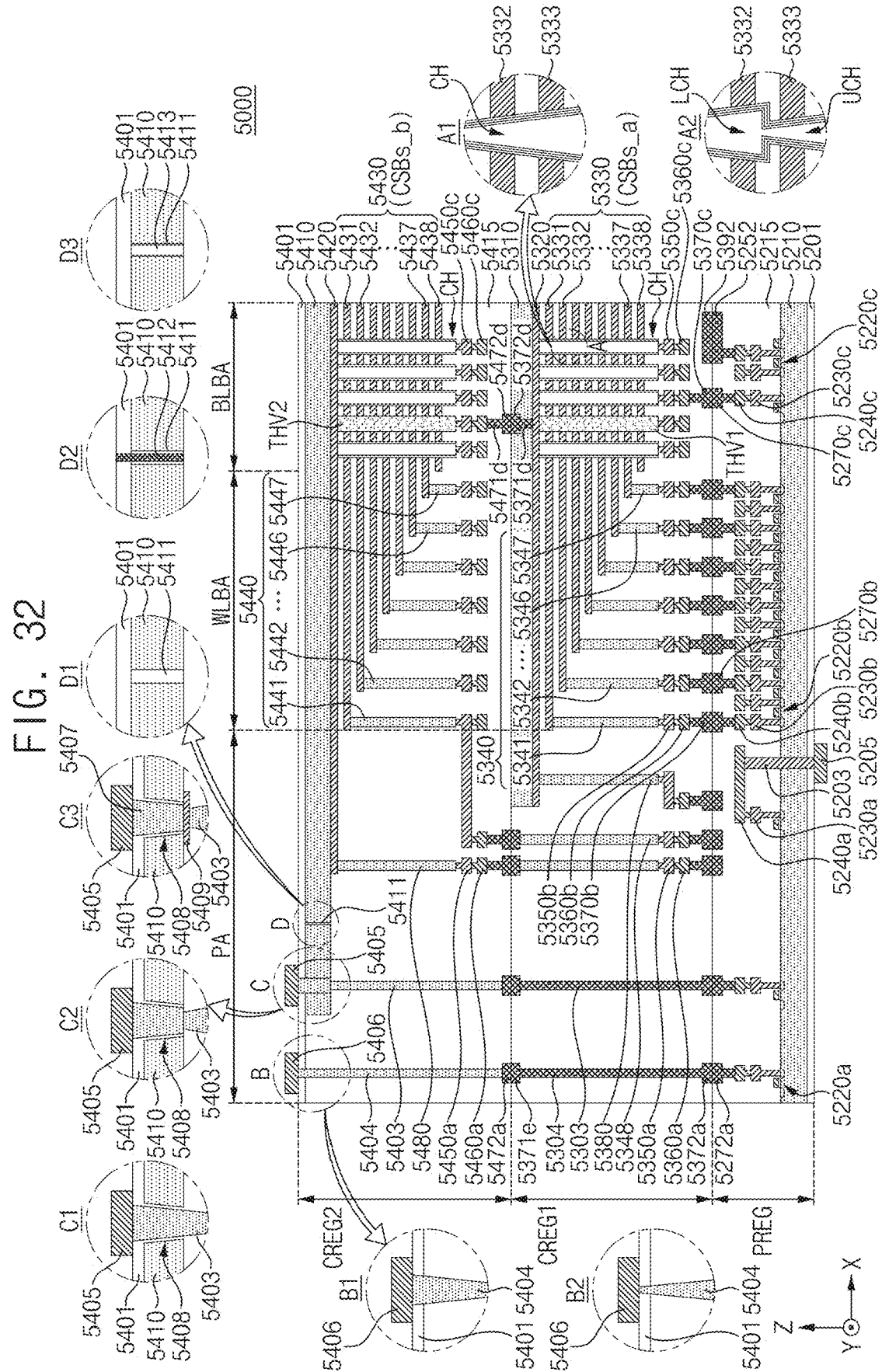
FIG. 32 is a cross-sectional view of an example of a nonvolatile memory device.

FIG. 32 is a cross-sectional view of an example of a nonvolatile memory device.

Referring to FIG. 32, a nonvolatile memory device (or a memory device) 5000 may have a chip-to-chip (C2C) structure. At least one upper chip including a cell region and a lower chip including a peripheral circuit region PREG may be manufactured separately, and then, the at least one upper chip and the lower chip may be connected to each other by a bonding method to realize the C2C structure. For example, the bonding method may mean a method of electrically or physically connecting a bonding metal pattern formed in an uppermost metal layer of the upper chip to a bonding metal pattern formed in an uppermost metal layer of the lower chip. For example, in a case in which the bonding metal patterns are formed of copper (Cu), the bonding method may be a Cu—Cu bonding method. Alternatively, the bonding metal patterns may be formed of aluminum (Al) or tungsten (W).

The memory device 5000 may include the at least one upper chip including the cell region. For example, as illustrated in FIG. 32, the memory device 5000 may include two upper chips. However, the number of the upper chips is not limited thereto. In the case in which the memory device 5000 includes the two upper chips, a first upper chip including a first cell region CREG1, a second upper chip including a second cell region CREG2 and the lower chip including the peripheral circuit region PREG may be manufactured separately, and then, the first upper chip, the second upper chip and the lower chip may be connected to each other by the bonding method to manufacture the memory device 5000. The first upper chip may be turned over and then may be connected to the lower chip by the bonding method, and the second upper chip may also be turned over and then may be connected to the first upper chip by the bonding method. Hereinafter, upper and lower portions of each of the first and second upper chips will be defined based on before each of the first and second upper chips is turned over. In other words, an upper portion of the lower chip may mean an upper portion defined based on a +Z-axis direction, and the upper portion of each of the first and second upper chips may mean an upper portion defined based on a −Z-axis direction in FIG. 25. However, example implementations are not limited thereto. In some implementations, one of the first upper chip and the second upper chip may be turned over and then may be connected to a corresponding chip by the bonding method.

Each of the peripheral circuit region PREG and the first and second cell regions CREG1 and CREG2 of the memory device 5000 may include an external pad bonding region PA, a word-line bonding region WLBA, and a bit-line bonding region BLBA.

The peripheral circuit region PREG may include a first substrate 5210 and a plurality of circuit elements 5220*a*, 5220*b* and 5220*c* formed on the first substrate 5210. An interlayer insulating layer 5215 including one or more insulating layers may be provided on the plurality of circuit elements 5220*a*, 5220*b* and 5220*c*, and a plurality of metal lines electrically connected to the plurality of circuit elements 5220*a*, 5220*b* and 5220*c* may be provided in the interlayer insulating layer 5215. For example, the plurality of metal lines may include first metal lines 5230*a*, 5230*b* and 5230*c* connected to the plurality of circuit elements 5220*a*, 5220*b* and 5220*c*, and second metal lines 5240*a*, 5240*b* and 5240*c* formed on the first metal lines 5230*a*, 5230*b* and 5230*c*. The plurality of metal lines may be formed of at least one of various conductive materials. For example, the first metal lines 5230*a*, 5230*b* and 5230*c* may be formed of tungsten having a relatively high electrical resistivity, and the second metal lines 5240*a*, 5240*b* and 5240*c* may be formed of copper having a relatively low electrical resistivity.

The first metal lines 5230*a*, 5230*b* and 5230*c* and the second metal lines 5240*a*, 5240*b* and 5240*c* are illustrated and described in the present implementations. However, example implementations are not limited thereto. In some implementations, at least one or more additional metal lines may further be formed on the second metal lines 5240*a*, 5240*b* and 5240*c*. In this case, the second metal lines 5240*a*, 5240*b* and 5240*c* may be formed of aluminum, and at least some of the additional metal lines formed on the second metal lines 5240*a*, 5240*b* and 5240*c* may be formed of copper having an electrical resistivity lower than that of aluminum of the second metal lines 5240*a*, 5240*b* and 5240*c*.

The interlayer insulating layer 5215 may be disposed on the first substrate 5210 and may include an insulating material such as silicon oxide and/or silicon nitride.

Each of the first and second cell regions CREG1 and CREG2 may include at least one memory block. The first cell region CREG1 may include a second substrate 5310 and a common source line 5320. A plurality of word-lines 5330 (5331 to 5338) may be stacked on the second substrate 5310 in a direction (i.e., the Z-axis direction) perpendicular to a top surface of the second substrate 5310. String selection lines and a ground selection line may be disposed on and under the word-lines 5330, and the plurality of word-lines 5330 may be disposed between the string selection lines and the ground selection line. Memory cells coupled to the plurality of word-lines 5330 may be divided into a plurality of sub-blocks SBs_a as mentioned above.

Likewise, the second cell region CREG2 may include a third substrate 5410 and a common source line 5420, and a plurality of word-lines 5430 (5431 to 5438) may be stacked on the third substrate 5410 in a direction (i.e., the Z-axis direction) perpendicular to a top surface of the third substrate 5410. Memory cells coupled to the plurality of word-lines 5430 may be divided into a plurality of sub-blocks SBs_b as mentioned above.

Each of the second substrate 5310 and the third substrate 5410 may be formed of at least one of various materials and may be, for example, a silicon substrate, a silicon-germanium substrate, a germanium substrate, or a substrate having a single-crystalline epitaxial layer grown on a single-crystalline silicon substrate. A plurality of channel structures CH may be formed in each of the first and second cell regions CREG1 and CREG2.

In some implementations, as illustrated in a region 'A1', the channel structure CH may be provided in the bit-line bonding region BLBA and may extend in the direction perpendicular to the top surface of the second substrate 5310 to penetrate the word-lines 5330, the string selection lines, and the ground selection line. The channel structure CH may include a data storage layer, a channel layer, and a filling insulation layer. The channel layer may be electrically connected to a first metal line 5350*c* and a second metal line 5360*c* in the bit-line bonding region BLBA. For example, the second metal line 5360*c* may be a bit-line and may be connected to the channel structure CH through the first metal line 5350*c*. The bit-line 5360*c* may extend in a first direction (e.g., a Y-axis direction) parallel to the top surface of the second substrate 5310.

In some implementations, as illustrated in a region 'A2', the channel structure CH may include a lower channel LCH and an upper channel UCH, which are connected to each other. For example, the channel structure CH may be formed by a process of forming the lower channel LCH and a process of forming the upper channel UCH. The lower channel LCH may extend in the direction perpendicular to the top surface of the second substrate 5310 to penetrate the common source line 5320 and lower word-lines 5331 and 5332. The lower channel LCH may include a data storage layer, a channel layer, and a filling insulation layer and may be connected to the upper channel UCH. The upper channel UCH may penetrate upper word-lines 5333 to 5338. The upper channel UCH may include a data storage layer, a channel layer, and a filling insulation layer, and the channel layer of the upper channel UCH may be electrically connected to the first metal line 5350*c* and the second metal line 5360*c*. As a length of a channel increases, due to characteristics of manufacturing processes, it may be difficult to form a channel having a substantially uniform width. The memory device 5000 according to the present implementations may include a channel having improved width uniformity due to the lower channel LCH and the upper channel UCH which are formed by the processes performed sequentially.

In the case in which the channel structure CH includes the lower channel LCH and the upper channel UCH as illustrated in the region 'A2', a word-line located near to a boundary between the lower channel LCH and the upper channel UCH may be a dummy word-line. For example, the word-lines 5332 and 5333 adjacent to the boundary between the lower channel LCH and the upper channel UCH may be the dummy word-lines. In this case, data may not be stored in memory cells connected to the dummy word-line. Alternatively, the number of pages corresponding to the memory cells connected to the dummy word-line may be less than the number of pages corresponding to the memory cells connected to a general word-line. A level of a voltage applied to the dummy word-line may be different from a level of a voltage applied to the general word-line, and thus it is possible to reduce an influence of a non-uniform channel width between the lower and upper channels LCH and UCH on an operation of the memory device.

Meanwhile, the number of the lower word-lines 5331 and 5332 penetrated by the lower channel LCH is less than the number of the upper word-lines 5333 to 5338 penetrated by the upper channel UCH in the region 'A2'. However, example implementations are not limited thereto. In some implementations, the number of the lower word-lines penetrated by the lower channel LCH may be equal to or more than the number of the upper word-lines penetrated by the upper channel UCH. In addition, structural features and connection relation of the channel structure CH disposed in the second cell region CREG2 may be substantially the same as those of the channel structure CH disposed in the first cell region CREG1.

In the bit-line bonding region BLBA, a first through-electrode THV1 may be provided in the first cell region CREG1, and a second through-electrode THV2 may be provided in the second cell region CREG2. As illustrated in FIG. 32, the first through-electrode THV1 may penetrate the common source line 5320 and the plurality of word-lines 5330. In some implementations, the first through-electrode THV1 may further penetrate the second substrate 5310. The first through-electrode THV1 may include a conductive material. Alternatively, the first through-electrode THV1 may include a conductive material surrounded by an insulating material. The second through-electrode THV2 may have the same shape and structure as the first through-electrode THV1.

In some implementations, the first through-electrode THV1 and the second through-electrode THV2 may be electrically connected to each other through a first through-metal pattern 5372*d* and a second through-metal pattern 5472*d*. The first through-metal pattern 5372*d* may be formed at a bottom end of the first upper chip including the first cell region CREG1, and the second through-metal pattern 5472*d* may be formed at a top end of the second upper chip including the second cell region CREG2. The first through-electrode THV1 may be electrically connected to the first metal line 5350*c* and the second metal line 5360*c*. The second through-electrode THV2 may be electrically connected to a third metal line 5450*c* and a fourth metal line 5460*c*. A lower via 5371*d* may be formed between the first through-electrode THV1 and the first through-metal pattern 5372*d*, and an upper via 5471*d* may be formed between the second through-electrode THV2 and the second through-metal pattern 5472*d*. The first through-metal pattern 5372*d* and the second through-metal pattern 5472*d* may be connected to each other by the bonding method.

In addition, in the bit-line bonding region BLBA, an upper metal pattern 5252 may be formed in an uppermost metal layer of the peripheral circuit region PERI, and an upper metal pattern 5392 having the same shape as the upper metal pattern 5252 may be formed in an uppermost metal layer of the first cell region CREG1. The upper metal pattern 5392 of the first cell region CREG1 and the upper metal pattern 5252 of the peripheral circuit region PREG may be electrically connected to each other by the bonding method. In the bit-line bonding region BLBA, the bit-line 5360*c* may be electrically connected to a page buffer included in the peripheral circuit region PERI. For example, some of the circuit elements 5220*c* of the peripheral circuit region PREG may constitute the page buffer, and the bit-line 5360*c* may be electrically connected to the circuit elements 5220*c* constituting the page buffer through an upper bonding metal pattern 5370*c* of the first cell region CREG1 and an upper bonding metal pattern 5270*c* of the peripheral circuit region PERI.

Referring continuously to FIG. 32, in the word-line bonding region WLBA, the word-lines 5330 of the first cell region CREG1 may extend in a second direction (e.g., an X-axis direction) parallel to the top surface of the second substrate 5310 and may be connected to a plurality of cell contact plugs 5340 (5341 to 5347). First metal lines 5350*b* and second metal lines 5360*b* may be sequentially connected onto the cell contact plugs 5340 connected to the word-lines 5330. In the word-line bonding region WLBA, the cell contact plugs 5340 may be connected to the peripheral circuit region PREG through upper bonding metal patterns 5370*b* of the first cell region CREG1 and upper bonding metal patterns 5270*b* of the peripheral circuit region PERI.

The cell contact plugs 5340 may be electrically connected to a row decoder included in the peripheral circuit region PERI. For example, some of the circuit elements 5220*b* of the peripheral circuit region PREG may constitute the row decoder, and the cell contact plugs 5340 may be electrically connected to the circuit elements 5220*b* constituting the row decoder through the upper bonding metal patterns 5370*b* of the first cell region CREG1 and the upper bonding metal patterns 5270*b* of the peripheral circuit region PERI. In some implementations, an operating voltage of the circuit elements 5220*b* constituting the row decoder may be different from an operating voltage of the circuit elements 5220*c* constituting the page buffer. For example, the operating voltage of the circuit elements 5220*c* constituting the page buffer may be greater than the operating voltage of the circuit elements 5220*b* constituting the row decoder.

Likewise, in the word-line bonding region WLBA, the word-lines 5430 of the second cell region CREG2 may extend in the second direction (e.g., the X-axis direction) parallel to the top surface of the third substrate 5410 and may be connected to a plurality of cell contact plugs 5440 (5441 to 5447). The cell contact plugs 5440 may be connected to the peripheral circuit region PREG through an upper metal pattern of the second cell region CREG2 and lower and upper metal patterns and a cell contact plug 5348 of the first cell region CREG1.

In the word-line bonding region WLBA, the upper bonding metal patterns 5370*b* may be formed in the first cell region CREG1, and the upper bonding metal patterns 5270*b* may be formed in the peripheral circuit region PERI. The upper bonding metal patterns 5370*b* of the first cell region CREG1 and the upper bonding metal patterns 5270*b* of the peripheral circuit region PREG may be electrically connected to each other by the bonding method. The upper bonding metal patterns 5370*b* and the upper bonding metal patterns 5270*b* may be formed of aluminum, copper, or tungsten.

In the external pad bonding region PA, a lower metal pattern 5371*e* may be formed in a lower portion of the first cell region CREG1, and an upper metal pattern 5472*a* may be formed in an upper portion of the second cell region CREG2. The lower metal pattern 5371*e* of the first cell region CREG1 and the upper metal pattern 5472*a* of the second cell region CREG2 may be connected to each other by the bonding method in the external pad bonding region PA. Likewise, an upper metal pattern 5372*a* may be formed in an upper portion of the first cell region CREG1, and an upper metal pattern 5272*a* may be formed in an upper portion of the peripheral circuit region PERI. The upper metal pattern 5372*a* of the first cell region CREG1 and the upper metal pattern 5272*a* of the peripheral circuit region PREG may be connected to each other by the bonding method.

Common source line contact plugs 5380 and 5480 may be disposed in the external pad bonding region PA. The common source line contact plugs 5380 and 5480 may be formed of a conductive material such as a metal, a metal compound, and/or doped polysilicon. The common source line contact plug 5380 of the first cell region CREG1 may be electrically connected to the common source line 5320, and the common source line contact plug 5480 of the second cell region CREG2 may be electrically connected to the common source line 5420. A first metal line 5350a and a second metal line 5360a may be sequentially stacked on the common source line contact plug 5380 of the first cell region CREG1, and a first metal line 5450a and a second metal line 5460a may be sequentially stacked on the common source line contact plug 5480 of the second cell region CREG2.

Input/output pads 5205, 5405 and 5406 may be disposed in the external pad bonding region PA. Referring to FIG. 32, a lower insulating layer 5201 may cover a bottom surface of the first substrate 5210, and a first input/output pad 5205 may be formed on the lower insulating layer 5201. The first input/output pad 5205 may be connected to at least one of a plurality of the circuit elements 5220a disposed in the peripheral circuit region PREG through a first input/output contact plug 5203 and may be separated from the first substrate 5210 by the lower insulating layer 5201. In addition, a side insulating layer may be disposed between the first input/output contact plug 5203 and the first substrate 5210 to electrically isolate the first input/output contact plug 5203 from the first substrate 5210.

An upper insulating layer 5401 covering a top surface of the third substrate 5410 may be formed on the third substrate 5410. A second input/output pad 5405 and/or a third input/output pad 5406 may be disposed on the upper insulating layer 5401. The second input/output pad 5405 may be connected to at least one of the plurality of circuit elements 5220a disposed in the peripheral circuit region PREG through second input/output contact plugs 5403 and 5303, and the third input/output pad 5406 may be connected to at least one of the plurality of circuit elements 5220a disposed in the peripheral circuit region PREG through third input/output contact plugs 5404 and 5304.

In some example implementations, the third substrate 5410 may not be disposed in a region in which the input/output contact plug is disposed. For example, as illustrated in a region 'B', the third input/output contact plug 5404 may be separated from the third substrate 5410 in a direction parallel to the top surface of the third substrate 5410 and may penetrate an interlayer insulating layer 5415 of the second cell region CREG2 so as to be connected to the third input/output pad 5406. In this case, the third input/output contact plug 5404 may be formed by at least one of various processes.

In some example implementations, as illustrated in a region 'B1', the third input/output contact plug 5404 may extend in a third direction (e.g., the Z-axis direction), and a diameter of the third input/output contact plug 5404 may become progressively greater toward the upper insulating layer 5401. In other words, a diameter of the channel structure CH described in the region 'A1' may become progressively less toward the upper insulating layer 5401, but the diameter of the third input/output contact plug 5404 may become progressively greater toward the upper insulating layer 5401. For example, the third input/output contact plug 5404 may be formed after the second cell region CREG2 and the first cell region CREG1 are bonded to each other by the bonding method.

In some implementations, as illustrated in a region 'B2', the third input/output contact plug 5404 may extend in the third direction (e.g., the Z-axis direction), and a diameter of the third input/output contact plug 5404 may become progressively less toward the upper insulating layer 5401. In other words, like the channel structure CH, the diameter of the third input/output contact plug 5404 may become progressively less toward the upper insulating layer 5401. For example, the third input/output contact plug 5404 may be formed together with the cell contact plugs 5440 before the second cell region CREG2 and the first cell region CREG1 are bonded to each other.

In some implementations, the input/output contact plug may overlap with the third substrate 5410. For example, as illustrated in a region 'C', the second input/output contact plug 5403 may penetrate the interlayer insulating layer 5415 of the second cell region CREG2 in the third direction (e.g., the Z-axis direction) and may be electrically connected to the second input/output pad 5405 through the third substrate 5410. In this case, a connection structure of the second input/output contact plug 5403 and the second input/output pad 5405 may be realized by various methods.

In some example implementations, as illustrated in a region 'C1', an opening 5408 may be formed to penetrate the third substrate 5410, and the second input/output contact plug 5403 may be connected directly to the second input/output pad 5405 through the opening 5408 formed in the third substrate 5410. In this case, as illustrated in the region 'C1', a diameter of the second input/output contact plug 5403 may become progressively greater toward the second input/output pad 5405. However, example implementations are not limited thereto, and in some implementations, the diameter of the second input/output contact plug 5403 may become progressively less toward the second input/output pad 5405.

In some implementations, as illustrated in a region 'C2', the opening 5408 penetrating the third substrate 5410 may be formed, and a contact 5407 may be formed in the opening 5408. An end of the contact 5407 may be connected to the second input/output pad 5405, and another end of the contact 5407 may be connected to the second input/output contact plug 5403. Thus, the second input/output contact plug 5403 may be electrically connected to the second input/output pad 5405 through the contact 5407 in the opening 5408. In this case, as illustrated in the region 'C2', a diameter of the contact 5407 may become progressively greater toward the second input/output pad 5405, and a diameter of the second input/output contact plug 5403 may become progressively less toward the second input/output pad 5405. For example, the second input/output contact plug 5403 may be formed together with the cell contact plugs 5440 before the second cell region CREG2 and the first cell region CREG1 are bonded to each other, and the contact 5407 may be formed after the second cell region CREG2 and the first cell region CREG1 are bonded to each other.

In some implementations illustrated in a region 'C3', a stopper 5409 may further be formed on a bottom end of the opening 5408 of the third substrate 5410, as compared with the implementations of the region 'C2'. The stopper 5409 may be a metal line formed in the same layer as the common source line 5420. Alternatively, the stopper 5409 may be a metal line formed in the same layer as at least one of the word-lines 5430. The second input/output contact plug 5403 may be electrically connected to the second input/output pad 5405 through the contact 5407 and the stopper 5409.

Like the second and third input/output contact plugs 5403 and 5404 of the second cell region CREG2, a diameter of each of the second and third input/output contact plugs 5303 and 5304 of the first cell region CREG1 may become progressively less toward the lower metal pattern 5371e or may become progressively greater toward the lower metal pattern 5371e.

Meanwhile, in some example implementations, a slit 5411 may be formed in the third substrate 5410. For example, the slit 5411 may be formed at a certain position of the external pad bonding region PA. For example, as illustrated in a region 'D', the slit 5411 may be located between the second input/output pad 5405 and the cell contact plugs 5440 when viewed in a plan view. Alternatively, the second input/output pad 5405 may be located between the slit 5411 and the cell contact plugs 5440 when viewed in a plan view.

In some implementations, as illustrated in a region 'D1', the slit 5411 may be formed to penetrate the third substrate 5410. For example, the slit 5411 may be used to prevent or reduce the third substrate 5410 from being finely cracked when the opening 5408 is formed. However, example implementations are not limited thereto, and in some implementations, the slit 5411 may be formed to have a depth ranging from about 60% to about 70% of a thickness of the third substrate 5410.

In some implementations, as illustrated in a region 'D2', a conductive material 5412 may be formed in the slit 5411. For example, the conductive material 5412 may be used to discharge a leakage current occurring in driving of the circuit elements in the external pad bonding region PA to the outside. In this case, the conductive material 5412 may be connected to an external ground line.

In some implementations, as illustrated in a region 'D3', an insulating material 5413 may be formed in the slit 5411. For example, the insulating material 5413 may be used to electrically isolate the second input/output pad 5405 and the second input/output contact plug 5403 disposed in the external pad bonding region PA from the word-line bonding region WLBA. Since the insulating material 5413 is formed in the slit 5411, it is possible to prevent or reduce a voltage provided through the second input/output pad 5405 from affecting a metal layer disposed on the third substrate 5410 in the word-line bonding region WLBA.

Meanwhile, in some implementations, the first to third input/output pads 5205, 5405 and 5406 may be selectively formed. For example, the memory device 5000 may be realized to include only the first input/output pad 5205 disposed on the first substrate 5210, to include only the second input/output pad 5405 disposed on the third substrate 5410, or to include only the third input/output pad 5406 disposed on the upper insulating layer 5401.

In some example implementations, at least one of the second substrate 5310 of the first cell region CREG1 and the third substrate 5410 of the second cell region CREG2 may be used as a sacrificial substrate and may be completely or partially removed before or after a bonding process. An additional layer may be stacked after the removal of the substrate. For example, the second substrate 5310 of the first cell region CREG1 may be removed before or after the bonding process of the peripheral circuit region PREG and the first cell region CREG1, and then, an insulating layer covering a top surface of the common source line 5320 or a conductive layer for connection may be formed. Likewise, the third substrate 5410 of the second cell region CREG2 may be removed before or after the bonding process of the first cell region CREG1 and the second cell region CREG2, and then, the upper insulating layer 5401 covering a top surface of the common source line 5420 or a conductive layer for connection may be formed.

Figure 33:
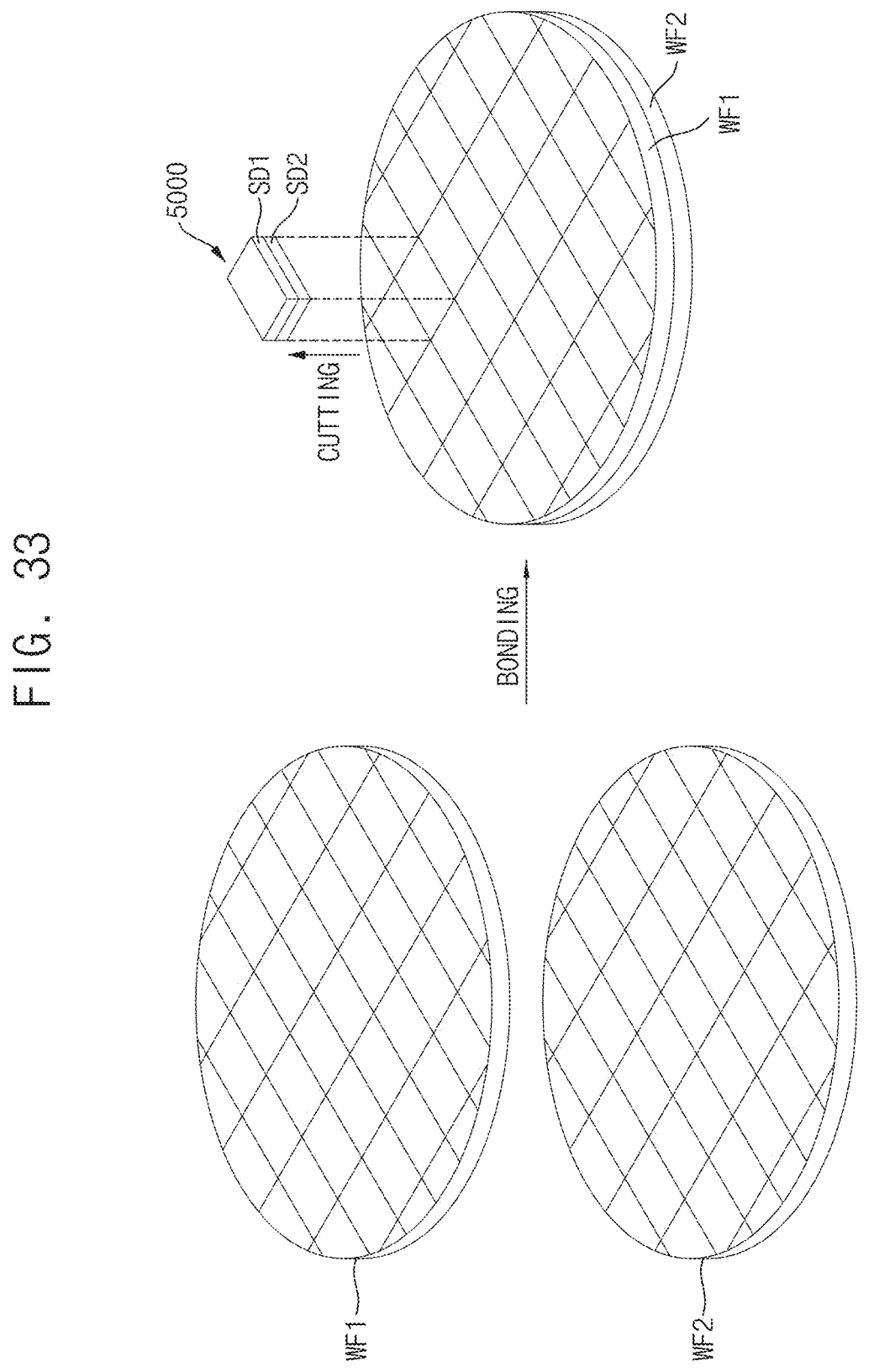

FIG. 33 is a diagram illustrating an example of a manufacturing process of a stacked semiconductor device.

Referring to FIG. 33, respective integrated circuits may be formed on a first wafer WF1 and a second wafer WF2. The memory cell array may be formed in the first wafer WF1, and the peripheral circuits may be formed in the second wafer WF2.

After the various integrated circuits have been respectively formed on the first and second wafers WF1 and WF2, the first wafer WF1 and the second wafer WF2 may be bonded together. The bonded wafers WF1 and WF2 may then be cut (or divided) into separate chips, in which each chip corresponds to a semiconductor device such as, for example, the memory device 6000, including a first semiconductor die SD1 and a second semiconductor die SD2 that are stacked vertically (e.g., the first semiconductor die SD1 is stacked on the second semiconductor die SD2, etc.). Each cut portion of the first wafer WF1 corresponds to the first semiconductor die SD1, and each cut portion of the second wafer WF2 corresponds to the second semiconductor die SD2. For example, the memory device 5000 of FIG. 32 may be manufactured based on the manufacturing process of FIG. 33.

Figure 34:
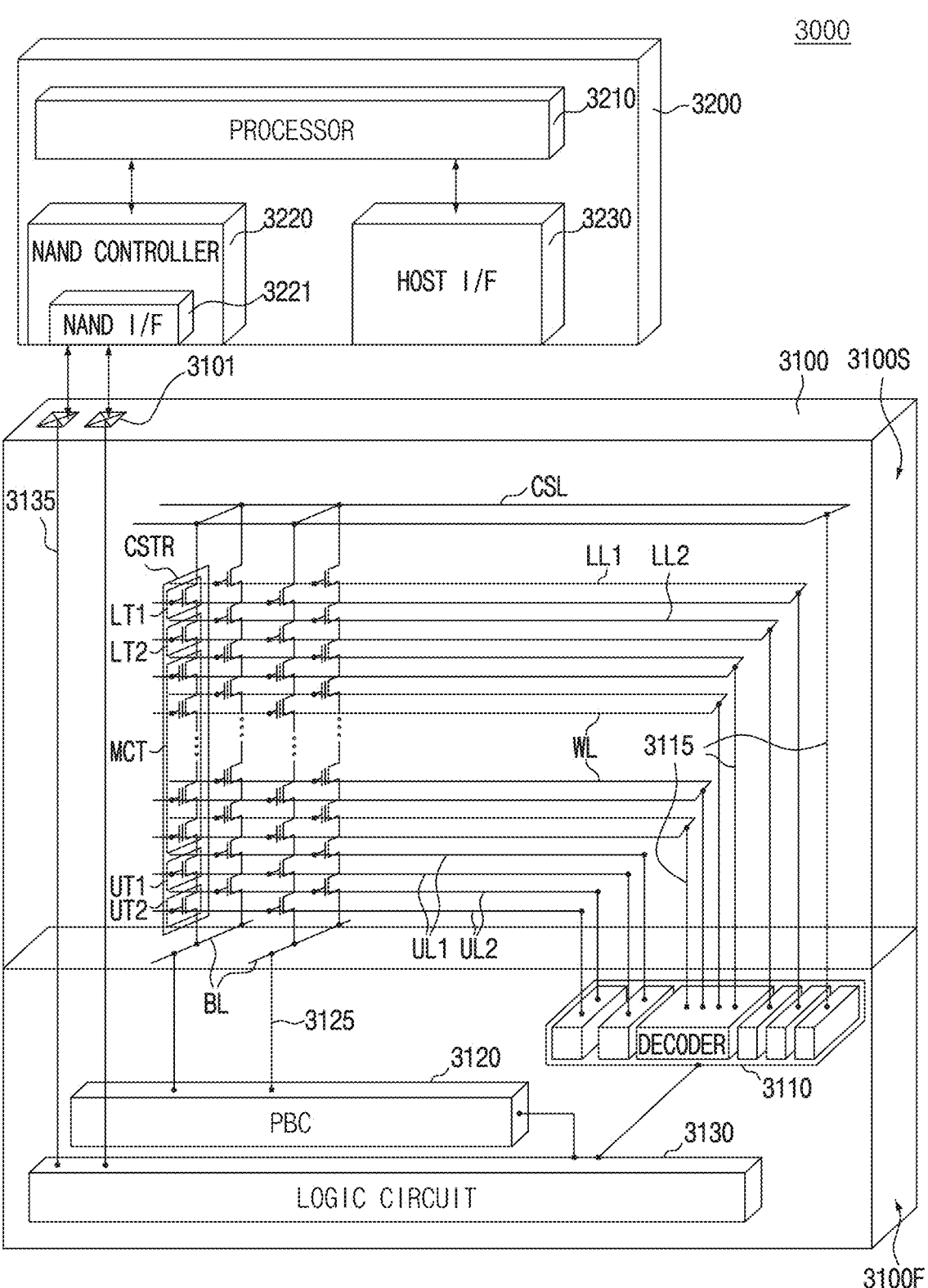
FIG. 34 is a block diagram illustrating an example of an electronic system including a semiconductor device.

FIG. 34 is a block diagram illustrating an example of an electronic system including a semiconductor device.

Referring to FIG. 34, an electronic system 3000 may include a semiconductor device 3100 and a controller 3200 electrically connected to the semiconductor device 3100. The electronic system 3000 may be a storage device including one or a plurality of semiconductor devices 3100 or an electronic device including a storage device. For example, the electronic system 3000 may be a solid state drive (SSD) device, a universal serial bus (USB), a computing system, a medical device, or a communication device that may include one or a plurality of semiconductor devices 3100.

The semiconductor device 3100 may be or may include a non-volatile memory device, for example, a nonvolatile memory device that is illustrated with reference to FIGS. 13 to 31. The semiconductor device 3100 may include a first structure 3100F and a second structure 3100S on the first structure 3100F. The first structure 3100F may be a peripheral circuit structure including a decoder circuit 3110, a page buffer circuit (PBC) 3120, and a logic circuit 3130. The second structure 3100S may be a memory cell structure including a bit-line BL, a common source line CSL, word-lines WL, first and second upper gate lines UL1 and UL2, first and second lower gate lines LL1 and LL2, and memory cell strings CSTR between the bit line BL and the common source line CSL.

In the second structure 3100S, each of the memory cell strings CSTR may include lower transistors LT1 and LT2 adjacent to the common source line CSL, upper transistors UT1 and UT2 adjacent to the bit-line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be varied in accordance with example implementations.

In some example implementations, the upper transistors UT1 and UT2 may include string selection transistors, and the lower transistors LT1 and LT2 may include ground selection transistors. The lower gate lines LL1 and LL2 may be gate electrodes of the lower transistors LT1 and LT2, respectively. The word lines WL may be gate electrodes of the memory cell transistors MCT, respectively, and the upper gate lines UL1 and UL2 may be gate electrodes of the upper transistors UT1 and UT2, respectively.

In some example implementations, the lower transistors LT1 and LT2 may include a lower erase control transistor LT1 and a ground selection transistor LT2 that may be connected with each other in serial. The upper transistors UT1 and UT2 may include a string selection transistor UT1 and an upper erase control transistor UT2. At least one of the lower erase control transistor LT1 and the upper erase control transistor UT2 may be used in an erase operation for erasing data stored in the memory cell transistors MCT through gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 3110 through first connection wirings 3115 extending to the second structure 3110S from the first structure 3100F. The bit-lines BL may be electrically connected to the page buffer circuit 3120 through second connection wirings 3125 extending to the second structure 3100S from the first structure 3100F.

In the first structure 3100F, the decoder circuit 3110 and the page buffer circuit 3120 may perform a control operation for at least one selected memory cell transistor among the plurality of memory cell transistors MCT. The decoder circuit 3110 and the page buffer circuit 3120 may be controlled by the logic circuit 3130. The semiconductor device 3100 may communicate with the controller 3200 through an input/output pad 3101 electrically connected to the logic circuit 3130. The input/output pad 3101 may be electrically connected to the logic circuit 3130 through an input/output connection wiring 3135 extending to the second structure 3100S from the first structure 3100F.

The controller 3200 may include a processor 3210, a NAND controller 3220, and a host interface (I/F) 3230. The electronic system 3000 may include a plurality of semiconductor devices 3100, and in this case, the controller 3200 may control the plurality of semiconductor devices 3100.

The processor 3210 may control operations of the electronic system 3000 including the controller 3200. The processor 3210 may be operated by firmware, and may control the NAND controller 3220 to access the semiconductor device 3100. The NAND controller 3220 may include a NAND interface 3221 for communicating with the semiconductor device 3100. Through the NAND interface 3221, control command for controlling the semiconductor device 3100, data to be written in the memory cell transistors MCT of the semiconductor device 3100, data to be read from the memory cell transistors MCT of the semiconductor device 3100, etc., may be transferred. The host interface 3230 may provide communication between the electronic system 3000 and an outside host. When control command is received from the outside host through the host interface 3230, the processor 3210 may control the semiconductor device 3100 in response to the control command.

A nonvolatile memory device or a storage device according to example implementations may be packaged using various package types or package configurations.

The example implementations may be applied to various electronic devices including a nonvolatile memory device. For example, the example implementations may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

While this specification contains many specific implementation details, these should not be construed as limitations on the scope of any invention or on the scope of what may be claimed, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

The foregoing is illustrative of example implementations and is not to be construed as limiting thereof. Although a few example implementations have been described, those skilled in the art will readily appreciate that many modifications are possible in the example implementations without materially departing from the novel teachings and advantages of the present disclosure. Accordingly, all such modifications are intended to be included within the scope of the present disclosure as defined in the claims.

What is claimed is:

1. A method of operating a nonvolatile memory device that includes a plurality of memory blocks, each memory block of the plurality of memory blocks including a plurality of cell strings, each cell string of the plurality of cell strings including a string selection transistor, a plurality of memory cells, and a ground selection transistor that are connected in series and arranged in a vertical direction between each bit-line of a plurality of bit-lines and a common source line, and the method comprising:

receiving an erase command and a block address, the block address designating a target memory block from the plurality of memory blocks;

determining, based on the erase command and the block address, whether the target memory block is an open block that includes at least one erased word-line or is a closed block that consists of a plurality of programmed word-lines;

based on determining that the target memory block is the closed block that consists of the plurality of programmed word-lines, applying a first pre-program voltage to the plurality of programmed word-lines of the target memory block during a pre-program period of an erase loop, the first pre-program voltage having a first voltage level; or based on determining that the target memory block is the open block that includes the at least one erased word-line, applying a second pre-program voltage to a portion of a region of the target memory block during the pre-program period, the second pre-program voltage having a second voltage level greater than the first voltage level, and the portion of the region of the target memory block including the at least one erased word-line.

2. The method of claim 1, comprising:

based on determining that the target memory block is the open block that includes the at least one erased word-line, applying an erase voltage to a channel of the target memory block during an erase execution period of the erase loop; and applying an erase verification voltage to the plurality of programmed word-lines of the target memory block during an erase verification period of the erase loop, the erase verification period being successive to the erase execution period.

3. The method of claim 2, comprising:

returning the second voltage level of the second preprogram voltage to the first voltage level after the erase verification period.

4. The method of claim 1, wherein each cell string of the plurality of cell strings are divided into a plurality of stacks in the vertical direction, and wherein applying the second pre-program voltage includes:

dividing each stack of the plurality of stacks of the target memory block into a plurality of regions; and adjusting the second voltage level of the second pre-program voltage based on whether each region of the plurality of regions includes the at least one erased word-line.

5. The method of claim 4, wherein adjusting the second voltage level includes:

applying the second pre-program voltage to at least a first region of the plurality of regions, the first region not including the at least one erased word-line; and applying a third pre-program voltage to at least a second region of the plurality of regions, the second region including the at least one erased word-line, the third pre-program voltage having a third voltage level greater than the second voltage level.

6. The method of claim 4, wherein adjusting the second voltage level includes:

based on a program/erase cycle count of at least one target region of the plurality of regions being increased, increasing the second voltage level of the second pre-program voltage that is applied to the at least one target region, the target region including the at least one erased word-line.

7. The method of claim 4, wherein adjusting the second voltage level includes:

decreasing the second voltage level of the second pre-program voltage that is applied to at least one target region of the plurality of regions, the target region including the at least one erased word-line according to increase of an operating temperature of the nonvolatile memory device.

8. The method of claim 4, wherein adjusting the second voltage level includes:

increasing, based on an increase in distance between the common source line and at least one target region of the plurality of regions in the vertical direction, the second voltage level of the second pre-program voltage that is applied to the at least one target region, the target region including the at least one erased word-line.

9. A nonvolatile memory device comprising:

a memory cell array including a plurality of memory blocks, each memory block of the plurality of memory blocks including a plurality of cell strings, each cell string of the plurality of cell strings including a string selection transistor, a plurality of memory cells, and a ground selection transistor which are connected in series and arranged in a vertical direction between each bit-line of a plurality of bit-lines and a common source line; and a control circuit configured to control an erase operation on a target memory block of the plurality of memory blocks, wherein controlling the erase operation on the target memory block comprises:

determining, based on an erase command and a block address, whether the target memory block is an open block including at least one erased word-line or a closed block consisting of a plurality of programmed word-lines, wherein the block address designates the target memory block from the plurality of memory block;

based on determining that the target memory block is the closed block consisting of the plurality of programmed word-lines, applying a first pre-program voltage to the plurality of programmed word-lines of the target memory block during pre-program period of an erase loop, the first pre-program voltage having a first voltage level; or based on determining that the target memory block is the open block including the at least one erased word-line, applying a second pre-program voltage to a portion of a region of the target memory block during the pre-program period, the second pre-program voltage having a second voltage level greater than the first voltage level, wherein the portion of the region of the target memory block includes the at least one erased word-line.

10. The nonvolatile memory device of claim 9, comprising:

a voltage generator configured to generate, based on a plurality of control signals, a plurality of word-line voltages, the plurality of word-line voltages including the first pre-program voltage, the second pre-program voltage, and an erase voltage; and an address decoder configured to provide, based on a row address, the plurality of word-line voltages to the target memory block.

11. The nonvolatile memory device of claim 10, wherein the control circuit is configured to control the voltage generator and the address decoder to:

apply, based on determining that the target memory block is the open block including the at least one erased word-line, the erase voltage to a channel of the target memory block during an erase execution period of the erase loop; and apply, based on determining that the target memory block is the open block including the at least one erased word-line, an erase verification voltage to the plurality of programmed word-lines of the target memory block during an erase verification period of the erase loop successive to the erase execution period.

12. The nonvolatile memory device of claim 11, wherein the control circuit is configured to control the voltage generator and the address decoder to float the plurality of programmed word-lines of the target memory block during the erase execution period.

13. The nonvolatile memory device of claim 11, wherein the control circuit is configured to control the voltage generator to return the second voltage level of the second pre-program voltage to the first voltage level after the erase verification period.

14. The nonvolatile memory device of claim 10, wherein each cell string of the plurality of cell strings are divided into a plurality of stacks in the vertical direction, wherein the control circuit is configured to divide each stack of the plurality of stacks into a plurality of regions, and wherein the control circuit is configured to control the voltage generator and the address decoder to adjust the second voltage level of the second pre-program voltage based on whether each region of the plurality of regions includes the at least one erased word-line.

15. The nonvolatile memory device of claim 14, wherein the control circuit is configured to control the voltage generator and the address decoder to:

apply the second pre-program voltage to at least a first region of the plurality of regions, the first region not including the at least one erased word-line; and apply a third pre-program voltage to at least a second region of the plurality of regions, the second region including the at least one erased word-line, the third pre-program voltage having a third voltage level greater than the second voltage level.

16. The nonvolatile memory device of claim 14, wherein the control circuit is configured to count, based on a command on the target memory block, program/erase cycles of the target memory block, and wherein the control circuit is configured to control, based on a program/erase cycle count of at least one target region of the plurality of regions being increased, the voltage generator and the address decoder to increase the second voltage level of the second pre-program voltage that is applied to the at least one target region, the target region including the at least one erased word-line.

17. The nonvolatile memory device of claim 14, comprising:

a temperature sensor configured to
sense an operating temperature of the nonvolatile memory device, and
provide, based on the operating temperature, the control circuit with a temperature signal, and wherein the control circuit is configured to control, based on the temperature signal indicating the operating temperature being increased, the voltage generator and the address decoder to decrease the second voltage level of the second pre-program voltage that is applied to at least one target region of the plurality of regions, the target region including the at least one erased word-line.

18. The nonvolatile memory device of claim 14, wherein the control circuit is configured to control, based on a distance between the common source line and at least one target region of the plurality of regions in the vertical direction, the voltage generator and the address decoder to change the second voltage level of the second pre-program voltage that is applied to the at least one target region, the target region including the at least one erased word-line.

19. The nonvolatile memory device of claim 10, wherein the control circuit includes:

a command decoder configured to generate a decoded command based on decoding a command, the command being received from an outside of the nonvolatile memory device;

an address buffer configured to
receive an address including the block address, and
output a row address included in the address;

a program/erase cycle counter configured to output, based on the decoded command, a counted value, the counted value being obtained based on counting program/erase cycles of the target memory block;

a comparator configured to output a comparison signal based on comparing the counted value with one or more reference values; and a control signal generator configured to generate the plurality of control signals based on at least one of the decoded command, the row address, or the comparison signal.

20. A nonvolatile memory device comprising:

a memory cell array including a plurality of memory blocks, each memory block of the plurality of memory blocks including a plurality of cell strings, each cell string of the plurality of cell strings including a string selection transistor, a plurality of memory cells, and a ground selection transistor which are connected in series and arranged in a vertical direction between each bit-line of a plurality of bit-lines and a common source line;

a control circuit configured to control an erase operation on a target memory block of the plurality of memory blocks, wherein controlling the erase operation on the target memory block comprises:

determining, based on an erase command and a block address, whether the target memory block is an open block including at least one erased word-line or a closed block consisting of a plurality of programmed word-lines, the block address designating the target memory block from the plurality of memory block;

based on determining that the target memory block is the closed block consisting of the plurality of programmed word-lines, applying a first pre-program voltage to the plurality of programmed word-lines of the target memory block during pre-program period of an erase loop, the first pre-program voltage having a first voltage level; and based on determining that the target memory block is the open block including the at least one erased word-line, applying a second pre-program voltage to a portion of a region of the target memory block during the pre-program period, the second pre-program voltage having a second voltage level greater than the first voltage level, and the portion of the region of the target memory block including the at least one erased word-line;

a voltage generator configured to generate, based on a plurality of control signals, a plurality of word-line voltages, the plurality of word-line voltages including the first pre-program voltage, the second pre-program voltage, and an erase voltage; and an address decoder configured to provide, based on a row address, the plurality of word-line voltages to the target memory block, and wherein the control circuit is configured to return the second voltage level of the second pre-program voltage to the first voltage level after an erase operation on the open block is completed.

* * * * *